(12) United States Patent
Son

(10) Patent No.: US 12,256,545 B2
(45) Date of Patent: Mar. 18, 2025

(54) SEMICONDUCTOR DEVICES AND DATA STORAGE SYSTEMS INCLUDING THE SAME

(71) Applicant: SAMSUNG ELECTRONICS CO., LTD., Suwon-si (KR)

(72) Inventor: Yonghoon Son, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 526 days.

(21) Appl. No.: 17/717,844

(22) Filed: Apr. 11, 2022

(65) Prior Publication Data
US 2023/0046500 A1  Feb. 16, 2023

(30) Foreign Application Priority Data
Aug. 13, 2021 (KR) .................. 10-2021-0107340

(51) Int. Cl.
*H10B 43/27* (2023.01)
*H01L 29/423* (2006.01)
*H10B 41/27* (2023.01)

(52) U.S. Cl.
CPC ....... *H10B 43/27* (2023.02); *H01L 29/42324* (2013.01); *H01L 29/4234* (2013.01); *H10B 41/27* (2023.02)

(58) Field of Classification Search
None
See application file for complete search history.

(56) References Cited

U.S. PATENT DOCUMENTS

| | | | |
|---|---|---|---|
| 9,911,692 B2 | 3/2018 | Smith et al. | |
| 10,490,569 B2 | 11/2019 | Mushiga et al. | |
| 10,685,975 B2 | 6/2020 | Baek | |
| 10,971,432 B2 | 4/2021 | Baek | |
| 2017/0256588 A1* | 9/2017 | Fukuda | H10B 41/20 |
| 2019/0326316 A1* | 10/2019 | Son | H10B 43/50 |
| 2020/0105783 A1 | 4/2020 | Baek | |
| 2020/0194456 A1* | 6/2020 | Baek | H10B 43/50 |
| 2020/0350249 A1* | 11/2020 | Kim | G11C 16/0483 |

* cited by examiner

*Primary Examiner* — Benjamin P Sandvik
(74) *Attorney, Agent, or Firm* — Myers Bigel, P.A.

(57) ABSTRACT

A semiconductor device includes a semiconductor structure that includes a substrate having a first region and a second region, gate electrodes stacked and spaced apart from each other in a first direction, extend at different lengths in a second direction on the second region, and include pad regions, interlayer insulating layers alternately stacked with the gate electrodes, channel structures penetrating the gate electrodes, extending in the first direction, and each including a channel layer, contact plugs penetrating the pad regions and extending in the first direction on the second region, and contact insulating layers between the gate electrodes and between ones of the contact plugs below the pad regions. The pad regions and the contact insulating layers protrude from the interlayer insulating layers toward the contact plugs in a horizontal direction.

20 Claims, 39 Drawing Sheets

SEMICONDUCTOR DEVICES AND DATA STORAGE SYSTEMS INCLUDING THE SAME

CROSS TO REFERENCE TO RELATED APPLICATION(S)

This application claims benefit of priority to Korean Patent Application No. 10-2021-0107340 filed on Aug. 13, 2021 in the Korean Intellectual Property Office, the disclosure of which is incorporated herein by reference in its entirety.

BACKGROUND

Example embodiments of the present disclosure relate to a semiconductor device and a data storage system including the same.

There has been demand for a semiconductor device which may store high-capacity data in a data storage system requiring data storage. Accordingly, increasing data storage capacity of a semiconductor device has been studied. For example, as one method of increasing data storage capacity of a semiconductor device, a semiconductor device including memory cells arranged three-dimensionally, instead of memory cells arranged two-dimensionally, has been suggested.

SUMMARY

Example embodiments of the present disclosure provide a semiconductor device having improved electrical properties and reliability.

Example embodiments of the present disclosure provide a data storage system including a semiconductor device having improved electrical properties and reliability.

According to some example embodiments of the present disclosure, a semiconductor device includes a first semiconductor structure including a first substrate, circuit devices on the first substrate, and circuit interconnection lines electrically connected to the circuit devices, and a second semiconductor structure on the first semiconductor structure. The second semiconductor includes a second substrate having a first region and a second region, gate electrodes stacked and spaced apart from each other in a first direction perpendicular to an upper surface of the second substrate, and extend at different lengths in the second direction on the second region, and including pad regions having upper surfaces exposed on the second region, interlayer insulating layers alternately stacked with the gate electrodes, channel structures on the first region which penetrate the gate electrodes and extend in the first direction, each of the channel structures including a channel layer, contact plugs that are connected to the pad regions of the gate electrodes and extend in the first direction and penetrate the pad regions, and contact insulating layers below the pad regions and respectively surrounding the contact plugs. The gate electrodes include a pad region having a first thickness and another region having a second thickness less than the first thickness. The contact plugs contact portions of upper surfaces, side surfaces, and lower surfaces of respective ones of the pad regions.

According to some example embodiments of the present disclosure, a semiconductor device includes a substrate having a first region and a second region, gate electrodes stacked and spaced apart from each other in a first direction perpendicular to an upper surface of the substrate, extending by different lengths in a second direction on the second region, and have pad regions on the second region, interlayer insulating layers alternately stacked with the gate electrodes, channel structures on the first region that penetrate the gate electrodes, and extend in the first direction, and each of the channel structures includes a channel layer, contact plugs which are on the second region and penetrate the pad regions and extend in the first direction, and contact insulating layers below the pad regions that are interposed between the gate electrodes and ones of the contact plugs The pad regions and the contact insulating layers protrude from the interlayer insulating layers toward the contact plugs in a horizontal direction.

According to some example embodiments of the present disclosure, a data storage system includes a semiconductor storage device including a substrate having a first region and a second region, circuit devices on one side of the substrate, and input/output pads electrically connected to the circuit devices, and a controller electrically connected to the semiconductor storage device through the input/output pad and configured to control the semiconductor storage device. The semiconductor storage device further includes gate electrodes stacked and spaced apart from each other in a first direction perpendicular to an upper surface of the substrate extend at different lengths in a second direction on the second region, and include pad regions on the second region, interlayer insulating layers alternately stacked with the gate electrodes, channel structures on the first region that penetrate the gate electrodes, and extend in the first direction, and each of the channel structures includes a channel layer, contact plugs that penetrate the pad regions and extend in the first direction on the second region, and contact insulating layers interposed between the gate electrodes and ones of the contact plugs below the pad regions. The contact plugs contact portions of upper surfaces, side surfaces, and lower surfaces of the pad regions.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

Figure 1:
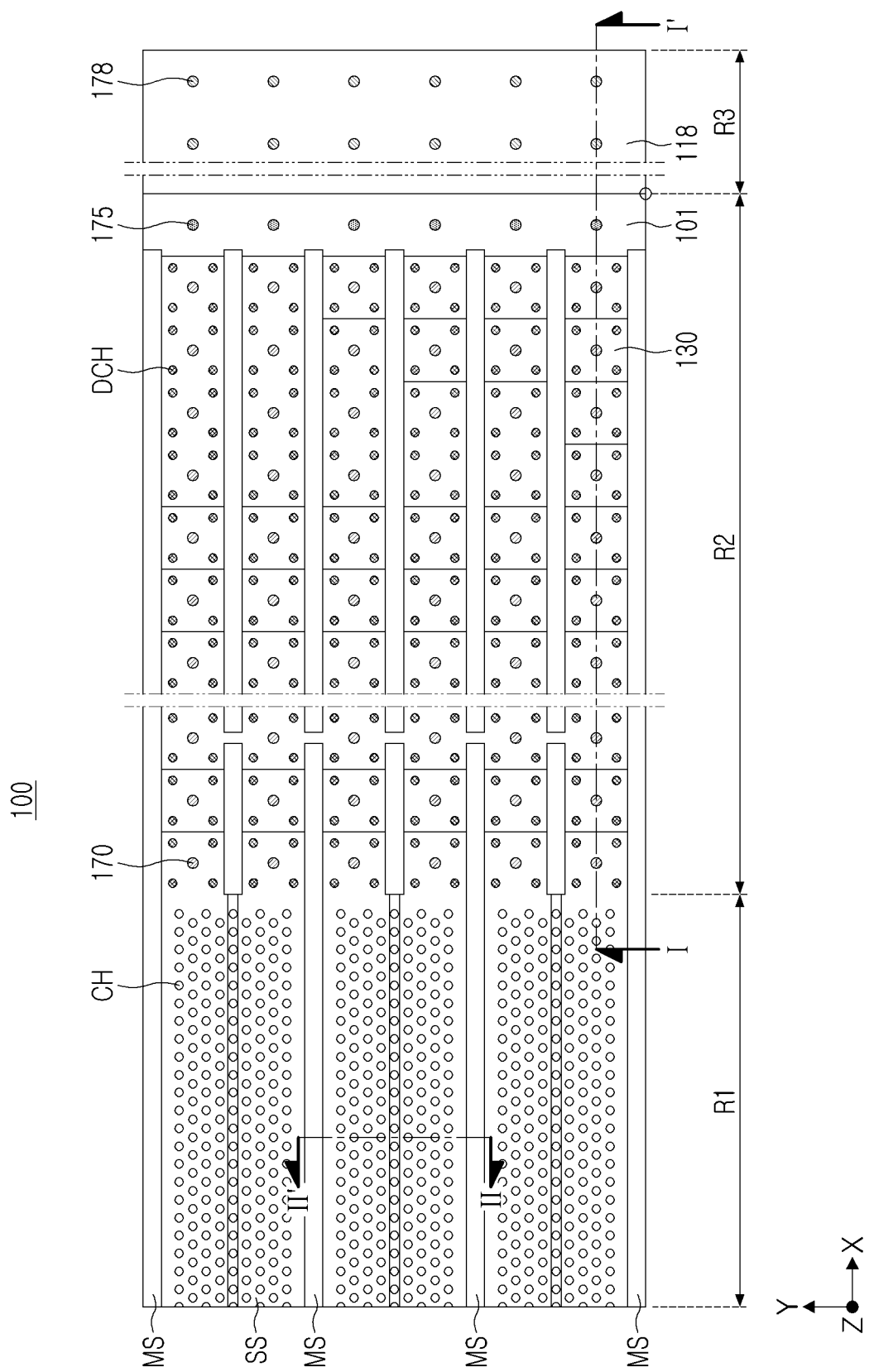
FIG. 1 is a plan view illustrating a semiconductor device according to example embodiments of the present disclosure.

FIG. 1 is a plan view illustrating a plan view illustrating a semiconductor device according to example embodiments.

Figure 2A:
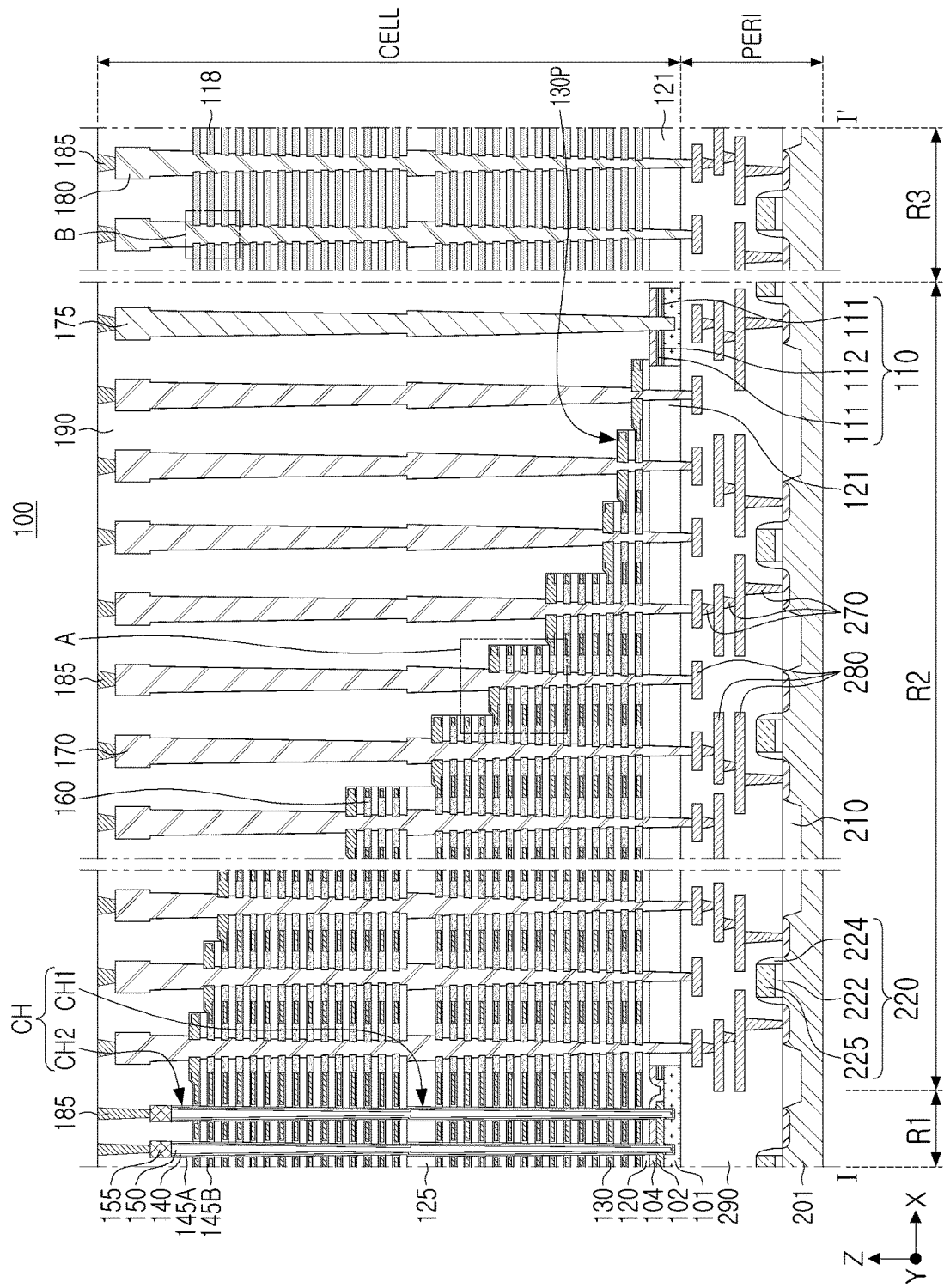
FIGS. 2A and 2B are cross-sectional views illustrating a semiconductor device according to example embodiments of the present disclosure.
Figure 2B:
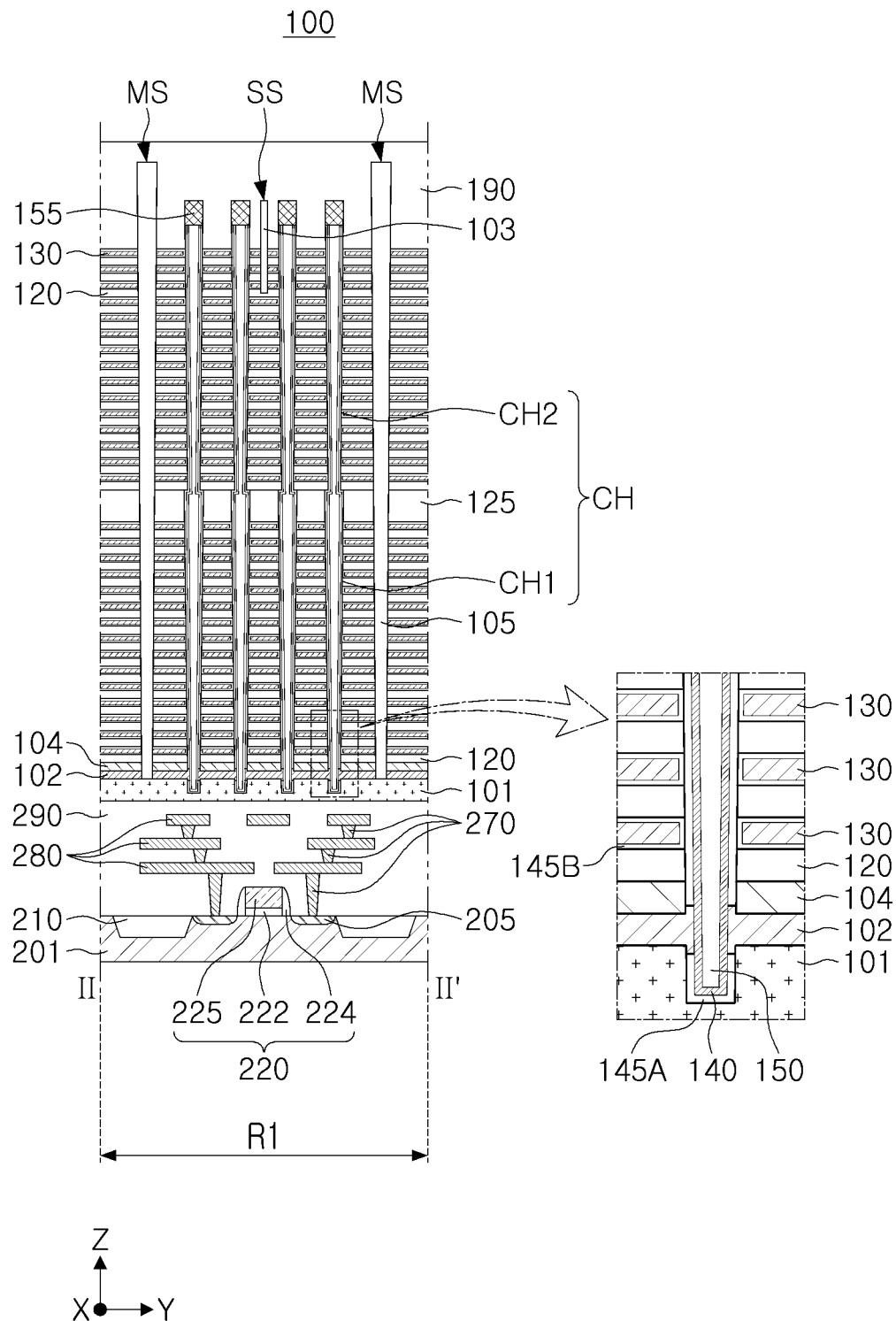

FIGS. 2A and 2B are cross-sectional views illustrating a semiconductor device according to example embodiments. FIG. 2A is a cross-sectional view taken along line I-I' in FIG. 1. FIG. 2B is a cross-sectional view taken along line II-II' in FIG. 1.

Figure 3A:
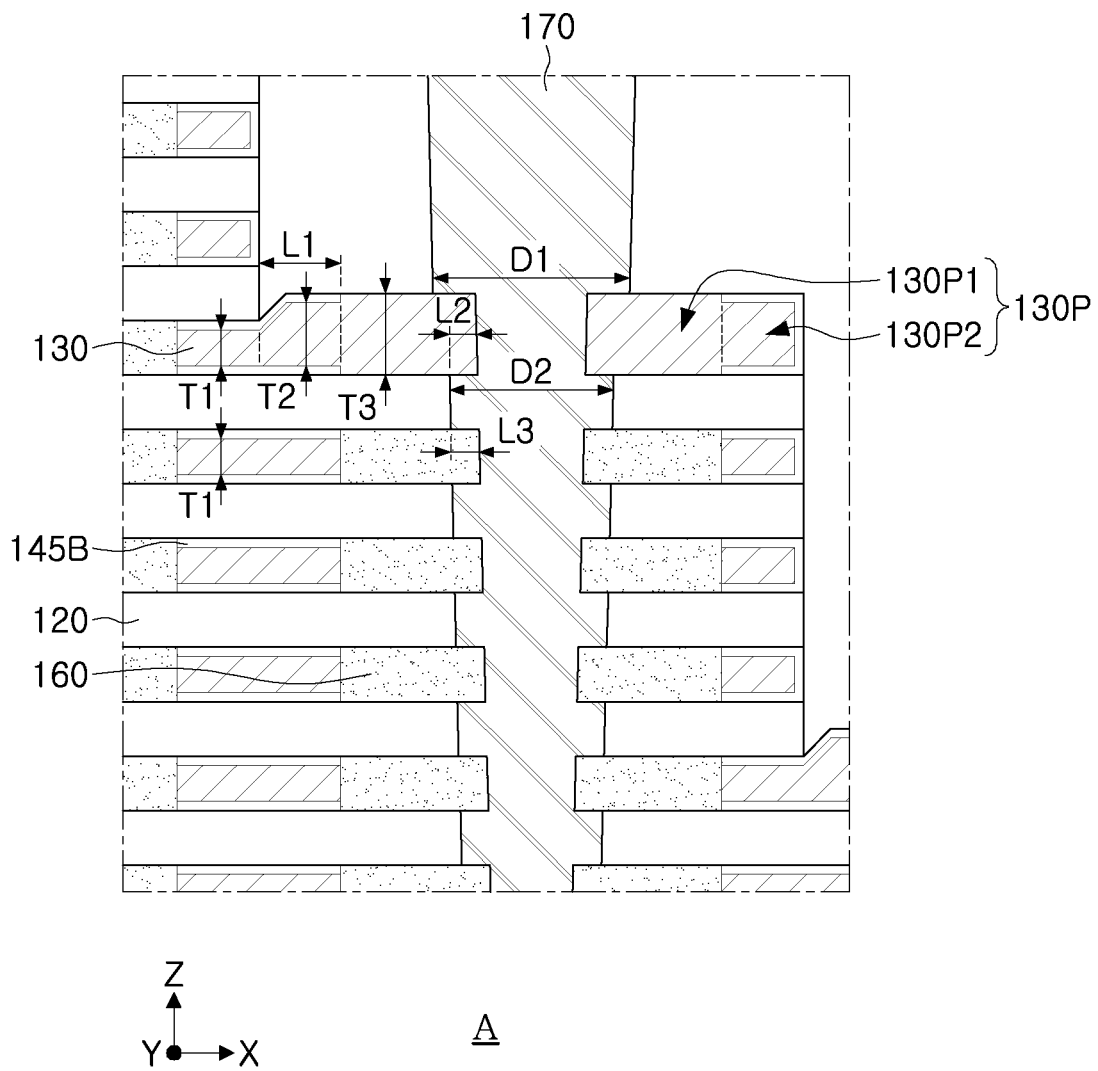
FIGS. 3A and 3B are an enlarged view illustrating a portion of a semiconductor device and a perspective view illustrating a semiconductor device according to example embodiments of the present disclosure, respectively.
Figure 3B:
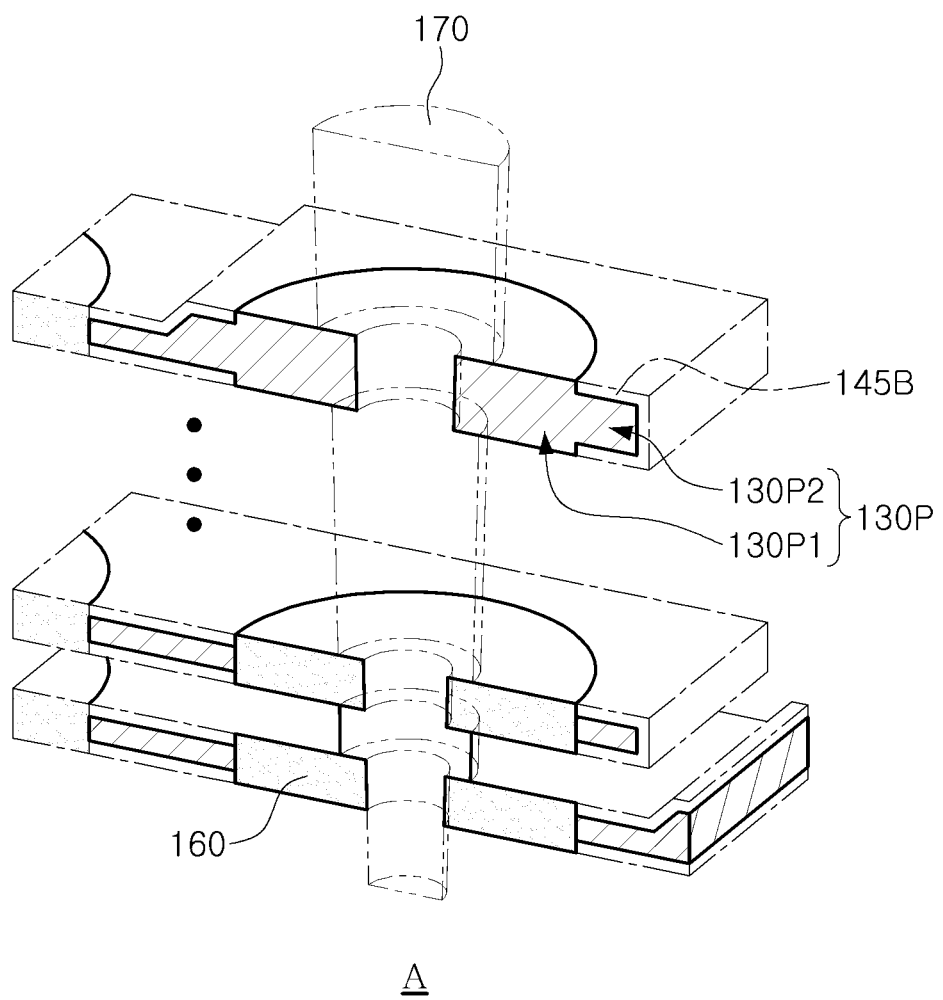

FIGS. 3A and 3B are an enlarged view illustrating a portion of a semiconductor device and a perspective view illustrating a semiconductor device according to example embodiments of the present disclosure, respectively. FIG. 3A is an enlarged view illustrating region "A" in FIG. 2A, and FIG. 3B is a perspective view illustrating region "A."

Figure 4:
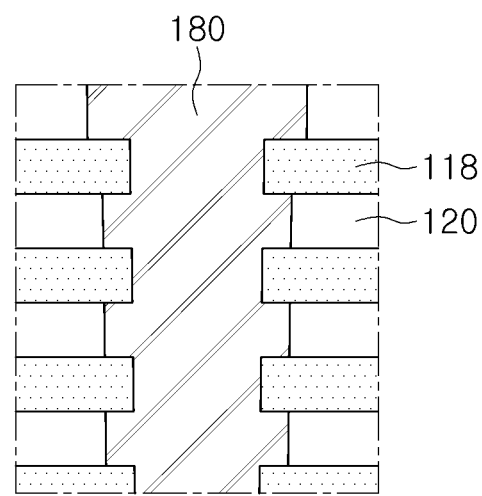
FIG. 4 is an enlarged view illustrating a portion of a semiconductor device according to example embodiments of the present disclosure.
Figure 4:
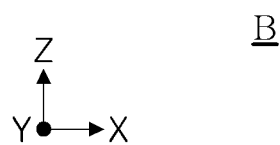

FIG. 4 is an enlarged view illustrating a portion of a semiconductor device according to example embodiments, illustrating region "B" in FIG. 2A.

Referring to FIGS. 1 to 4, a semiconductor device 100 may include a peripheral circuit region PERI, which may be a first semiconductor structure including a first substrate 201, and a memory cell region CELL, which may be a second semiconductor structure including a second substrate 101. The memory cell region CELL may be disposed on the peripheral circuit region PERI. In some example embodiments, the cell region CELL may be disposed below the peripheral circuit region PERI.

The peripheral circuit region PERI may include the first substrate 201, source/drain regions 205 and device isolation layers 210 in the first substrate 201, circuit devices 220 disposed on the first substrate 201, circuit contact plugs 270, circuit interconnection lines 280, and peripheral region insulating layer 290.

The first substrate 201 may have an upper surface extending in the X-direction and the Y-direction. An active region may be defined in the first substrate 201 by the device isolation layers 210. The source/drain regions 205 including impurities may be disposed in a portion of the active region.

The first substrate 201 may include a semiconductor material, such as, for example, a group IV semiconductor, a group III-V compound semiconductor, or a group II-VI compound semiconductor. The first substrate 201 may be provided as a bulk wafer or an epitaxial layer.

The circuit devices 220 may include a planar transistor. Each of the circuit devices 220 may include a circuit gate dielectric layer 222, a spacer layer 224, and a circuit gate electrode 225. The source/drain regions 205 may be disposed in the first substrate 201 on both sides of the circuit gate electrode 225.

The circuit contact plugs 270 and the circuit interconnection lines 280 may form a circuit interconnection structure electrically connected to the circuit devices 220 and the source/drain regions 205. The circuit contact plugs 270 may have a cylindrical shape, and the circuit interconnection lines 280 may have a linear shape. The circuit contact plugs 270 and the circuit interconnection lines 280 may include a conductive material, such as, for example, tungsten (W), copper (Cu), aluminum (Al), or similar, and each of the components may further include a diffusion barrier. However, in example embodiments, the number of layers of the circuit contact plugs 270 and the circuit interconnection lines 280 and the arrangements thereof may be varied.

The peripheral region insulating layer 290 may be disposed to cover the circuit device 220 on the first substrate 201. The peripheral region insulating layer 290 may be formed of an insulating material and may include one or more insulating layers.

The memory cell region CELL may include the second substrate 101 having a first region R1 and a second region R2, gate electrodes 130 stacked on the second substrate 101, the interlayer insulating layers 120 alternately stacked with the gate electrodes 130, the channel structures CH disposed to penetrate the stack structure of the gate electrodes 130, separation regions MS extending by penetrating the stack structure of the gate electrodes 130, contact plugs 170 connected to the pad regions 130P of the gate electrodes 130 and extending vertically, and contact insulating layers 160 surrounding the contact plugs 170.

The memory cell region CELL may include first and second horizontal conductive layers 102 and 104 disposed below the gate electrodes 130 on the first region R1, horizontal insulating layer 110 disposed below the gate electrodes 130 on the second region R2, upper separation regions SS penetrating a portion of the gate electrodes 130, sacrificial insulating layers 118 on an external side of the gate electrodes 130, a substrate contact 175 connected to the second substrate 101, through-vias 180 penetrating the sacrificial insulating layers 118, upper interconnections 185 on the contact plugs 170, and a cell region insulating layer 190 covering the gate electrodes 130.

In the first region R1 of the second substrate 101, the gate electrodes 130 may be vertically stacked and the channel structures CH may be disposed, and the first region R1 may be a region in which memory cells may be disposed. In the second region R2 of the second substrate 101, the gate electrodes 130 may extend by different lengths, and the second region R2 may be a region that electrically connects the memory cells to the peripheral circuit region PERI. The second region R2 may be disposed on at least one end of the first region R1 in at least one direction, such as, for example, the X-direction. The second substrate 101 may be in the form of a plating layer, and may function as at least a portion of a common source line of the semiconductor device 100.

The second substrate 101 may have an upper surface extending in the X-direction and the Y-direction. The second substrate 101 may include a semiconductor material, such as, for example, a group IV semiconductor, a group III-V compound semiconductor, or a group II-VI compound semiconductor. For example, a group IV semiconductor may include silicon, germanium, or silicon-germanium. The second substrate 101 may further include impurities. The second substrate 101 may be provided as a polycrystalline semiconductor layer such as a polycrystalline silicon layer or an epitaxial layer.

The first and second horizontal conductive layers 102 and 104 may be stacked in order on the upper surface of the first region R1 of the second substrate 101. The first horizontal conductive layer 102 may not extend to the second region R2 of the second substrate 101, and the second horizontal conductive layer 104 may extend to the second region R2. The first horizontal conductive layer 102 may function as a portion of a common source line of the semiconductor device 100, and for example, may function as a common source line together with the second substrate 101. As illustrated in the enlarged view in FIG. 2B, the first horizontal conductive layer 102 may be directly connected to the channel layer 140 around the channel layer 140. The second horizontal conductive layer 104 may be in contact with the second substrate 101 in regions in which the first horizontal conductive layer 102 and the horizontal insulating layer 110 are not disposed. The second horizontal conductive layer 104 may cover an end of the first horizontal conductive layer 102 or the horizontal insulating layer 110 in the regions and may be bent to extend to the second substrate 101.

The first and second horizontal conductive layers 102 and 104 may include a semiconductor material, such as, for example polycrystalline silicon. In this case, at least the first horizontal conductive layer 102 may be doped with impurities of the same conductivity type as that of the second substrate 101, and the second horizontal conductive layer 104 may be a doped layer or a layer including impurities diffused from the first horizontal conductive layer 102. However, the material of the second horizontal conductive layer 104 is not limited to the semiconductor material, and may be replaced with an insulating layer.

The horizontal insulating layer 110 may be disposed on the second substrate 101 side by side with the first horizontal conductive layer 102 in at least a portion of the second region R2. The horizontal insulating layer 110 may include first and second horizontal insulating layers 111 and 112 alternately stacked on the second region R2 of the second substrate 101. The horizontal insulating layer 110 may be layers remaining after a portion of the first horizontal conductive layer 102 are replaced with the first horizontal conductive layers 102 in the process of manufacturing the semiconductor device 100.

The horizontal insulating layer 110 may include silicon oxide, silicon nitride, silicon carbide, or silicon oxynitride. The first horizontal insulating layers 111 and the second horizontal insulating layer 112 may include different insulating materials. For example, the first horizontal insulating layers 111 may be formed of the same material as that of the interlayer insulating layers 120, and the second horizontal insulating layer 112 may be formed of a material different from that of the interlayer insulating layers 120.

The substrate insulating layer 121 may be disposed to penetrate through the second substrate 101, the horizontal insulating layer 110, and the second horizontal conductive layer 104 in at least a portion of the second region R2. Also, the substrate insulating layer 121 may be disposed in the third region R3 of the memory cell region CELL from which the second substrate 101 is removed. The third region R3 may be, for example, a through-interconnection region disposed on an external side of the second substrate 101 and/or in the first region R1 and the second region R2. The lower surface of the substrate insulating layer 121 may be coplanar with the lower surface of the second substrate 101 or may be disposed on a level lower than a level of the lower surface of the second substrate 101.

In the second region R2, the substrate insulating layer 121 may be disposed to surround the contact plugs 170 in a plan view. The substrate insulating layer 121 may be disposed to surround the entire contact plugs 170 in a plan view, but example embodiments thereof are not limited thereto. The contact plugs 170 may be electrically separated from each other by the substrate insulating layer 121. The substrate insulating layer 121 may include an insulating material, such as, for example, silicon oxide, silicon nitride, silicon carbide, or silicon oxynitride.

The gate electrodes 130 may be vertically stacked and spaced apart on the second substrate 101 and may form a stack structure. The gate electrodes 130 may include lower gate electrodes forming a gate of a ground select transistor, memory gate electrodes forming the plurality of memory cells, and upper gate electrodes forming gates of string select transistors. The number of the memory gate electrodes included in the memory cells may be determined according to capacity of the semiconductor device 100. According to example embodiments, each of the number of the upper gate electrodes and the number of the lower gate electrodes may be 1 to 4 or more, and may have a structure the same as, similar to, or different from the memory gate electrodes. In example embodiments, the gate electrodes 130 may further include an erase gate electrode disposed above the upper gate electrodes and/or below the lower gate electrodes and forming an erase transistor used in an erase operation using a gate induced drain leakage (GIDL) phenomenon. Also, a portion of the gate electrodes 130, such as, for example, memory gate electrodes 130 adjacent to the upper or lower gate electrodes, may be dummy gate electrodes.

The gate electrodes 130 may be separated from each other in the Y-direction by the separation regions MS continuously extending from the first region R1 and the second region R2 of the separation regions MS. The gate electrodes 130 between the separation regions MS may form a single memory block, but example embodiments of the memory block are not limited thereto. A portion of the gate electrodes 130, such as, for example, the memory gate electrodes may form a single layer in a single memory block.

The gate electrodes 130 may be vertically stacked and spaced apart from each other on the first region R1 and the second region R2, may extend by different lengths from the first region R1 to the second region R2, and may form a step structure having a staircase shape in a portion of the second region R2. The gate electrodes 130 may be disposed to have a step structure even in the Y-direction. Due to the step structure, among the gate electrodes 130, the lower gate electrode 130 may extend longer than the upper gate electrode 130, such that the gate electrodes 130 may have regions having upper surfaces exposed upwardly from the interlayer insulating layers 120 and the other gate electrodes 130, and the above regions may be referred to as pad regions 130P. In each gate electrode 130, the pad region 130P may be a region including an end of the gate electrode 130 in the X-direction. The pad region 130P may be a region of an uppermost gate electrode 130 in each region among the gate electrodes 130 included in the stack structure in the second region R2. The gate electrodes 130 may be connected to the contact plugs 170 in the pad regions 130P, respectively. The gate electrodes 130 may have an increased thickness in the pad regions 130P.

As illustrated in FIGS. 3A and 3B, the gate electrodes 130 may extend from the first region R1 toward the second region R2 by a first thickness T1, and may have a second thickness T2 and a third thickness T3 greater than the first thickness T1 in the pad region 130P marked by a dotted line in FIGS. 3A and 3B. The pad region 130P may include a first pad portion 130P1 including a region in contact with the contact plug 170 and having a third thickness T3, and a second pad portion 130P2 surrounding the first pad portion 130P1 and having a third thickness T2 less than the third thickness T3. The first pad portion 130P1 may include a region overlapping the contact plug 170 in the Z-direction, and may include a region overlapping the contact insulating layers 160. The first pad portion 130P1 may be formed in a process different from a process of forming the second pad portion 130P2, such that a boundary between the first pad portion 130P1 and the second pad portion 130P2 may be distinct.

For example, the second thickness T2 may be in a range from about 120% to about 180% of the first thickness T1. The second thickness T2 may be greater than a thickness of the thickest gate electrode 130 in the first region R1 among the gate electrodes 130. Differently from the second pad portion 130P2, the second gate dielectric layer 145B may not be disposed in the first pad portion 130P1. Accordingly, the first pad portion 130P1 may have a third thickness T3 greater than the second pad portion 130P2 by the thickness of the second gate dielectric layers 145B on the upper and lower surfaces of the second pad portion 130P2. In example embodiments, the length L1 of the second pad portion 130P2 in the X-direction on one side of the first pad portion 130P1 may be varied, and the length of the second pad portion 130P2 in the X-direction on the other side of the first pad portion 130P1 may be varied.

The pad region 130P, particularly the first pad portion 130P1, may protrude toward the contact plug 170 around the contact plug 170 together with the contact insulating layers 160 disposed therebelow. Accordingly, a portion of an upper surface, a side surface, and a portion of a lower surface of the pad region 130P may be in contact with the contact plug 170. Since the pad region 130P may be continuously in contact with the contact plug 170 through three surfaces, contact resistance may be reduced as compared to the example in which the pad region 130P is in contact with the contact plug 170 only through the side surfaces.

A length L2 of the pad region 130P protruding from the interlayer insulating layers 120 toward the contact plug 170 may be substantially the same as a length L3 of the contact insulating layers 160 protruding therebelow. In example embodiments, "substantially the same" may indicate that the elements may be the same or there may be difference in the range of deviations occurring in the manufacturing process, and even when the expression "substantially" is omitted, the configuration may be interpreted in the same manner. The lengths L2 and L3 of the protrusion may be, for example, a length on the center in the Z-direction, and the degree protrusion may be varied in example embodiments. The area in which the upper surface of the pad region 130P is in contact with the contact plug 170 may be larger than the area in which the lower surface of the pad region 130P is in contact with the contact plug 170, and the relative relationship between the contact areas may be varied depending on a width of the contact plug 170 on the pad region 130P, an inclination of the contact plug 170, or the like.

The gate electrodes 130 may have side surfaces in direct contact with the contact insulating layers 160 below the pad region 130P. That is, as illustrated in FIG. 3A, the second gate dielectric layer 145B may not be interposed between the gate electrodes 130 and the contact insulating layers 160.

The gate electrodes 130 may include a metal material, such as, for example, tungsten (W). In example embodiments, the gate electrodes 130 may include polycrystalline silicon or a metal silicide material. In example embodiments, the gate electrodes 130 may further include a diffusion barrier, such as, for example, tungsten nitride (WN), tantalum nitride (TaN), or titanium nitride (TiN), or a combination thereof.

The interlayer insulating layers 120 may be disposed between the gate electrodes 130. Similarly to the gate electrodes 130, the interlayer insulating layers 120 may be spaced apart from each other in a direction perpendicular to the upper surface of the second substrate 101 and may extend in the X-direction. The interlayer insulating layers 120 may include an insulating material such as silicon oxide or silicon nitride.

The sacrificial insulating layers 118 may be disposed on the same level as the level of the gate electrodes 130 may have the same thickness as that of the gate electrodes 130 in the third region R3, and the side surfaces may be in contact with the gate electrodes 130 in a region not illustrated. The sacrificial insulating layers 118 may be disposed to surround the through-vias 180 in a plan view, and may be connected to each other between the through-vias 180 adjacent to each other. The sacrificial insulating layers 118 may be disposed to have a width the same as or different from that of the lower substrate insulating layer 121. The sacrificial insulating layers 118 may be formed of an insulating material different from that of the interlayer insulating layers 120, and may include, for example, silicon oxide, silicon nitride, or silicon oxynitride.

The separation regions MS may be disposed to penetrate the gate electrodes 130 and may extend in the X-direction in the first region R1 and the second region R2. As illustrated in FIG. 1, the separation regions MS may be disposed parallel to each other. Some of the separation regions MS may extend as an integrated portion along the first region R1 and the second region R2, and the other portion may extend only to a portion of the second region R2, or may be intermittently disposed in the first region R1 and the second region R2. However, in example embodiments, the arrangement order of the separation regions MS and a distance between the separation regions MS may be varied. As illustrated in FIG. 2B, the separation regions MS may penetrate the entire gate electrodes 130 stacked on the second substrate 101 and may be connected to the second substrate 101. A separation insulating layer 105 may be disposed in the separation regions MS.

The upper separation regions SS may extend in the X-direction between the separation regions MS. The upper separation regions SS may be disposed in a portion of the second region R2 and the first region R1 to penetrate a portion of the gate electrodes 130 including the uppermost gate electrode 130 of the gate electrodes 130. As illustrated in FIG. 2B, the upper separation regions SS may separate, for example, three gate electrodes 130 from each other in the Y-direction. However, the number of gate electrodes 130 separated by the upper separation regions SS may be varied in example embodiments. The upper separation regions SS may include an upper separation insulating layer 103.

Each of the channel structures CH may form a single memory cell string, and may be spaced apart from each other while forming rows and columns on the first region R1. The channel structures CH may form a grid pattern on an x-y plane or may be disposed in a zigzag pattern in one direction. Each of the channel structures CH may have a columnar shape, and may have an inclined side surface of which a width may decrease toward the second substrate 101 depending on an aspect ratio. As illustrated in FIG. 1, dummy channels DCH may be disposed in the second region R2. The dummy channels DCH may also be disposed in the second region R2 and may work as a support during the process of manufacturing the semiconductor device 100, and may have a structure the same as, similar to, or different from the channel structures CH. In example embodiments, the channel structures CH disposed adjacent to the end of the first region R1 may also be dummy channels which do not substantially form a memory cell string.

The channel structures CH may include vertically stacked first and second channel structures CH1 and CH2. The channel structures CH may have a shape in which the lower first channel structures CH1 and the upper second channel structures CH2 are connected to each other, and may have a bent portion due to a difference in width in the connection region. However, in example embodiments, the number of channel structures stacked in the Z-direction may be varied.

Each of the channel structures CH may include a channel layer 140, a first gate dielectric layer 145A, a channel filling insulating layer 150, and a channel pad 155 disposed in the channel hole. As illustrated in the enlarged view in FIG. 2B, the channel layer 140 may be formed in an annular shape surrounding the channel filling insulating layer 150 therein, or in example embodiments, the channel layer 140 may have a columnar shape such as a cylinder or a prism without the channel filling insulating layer 150. The channel layer 140 may be connected to the first horizontal conductive layer 102 in a lower portion. The channel layer 140 may include a semiconductor material such as polycrystalline silicon or single crystal silicon.

The first gate dielectric layer 145A may be disposed between the gate electrodes 130 and the channel layer 140 together with the second gate dielectric layer 145B. Although not specifically illustrated, the first gate dielectric layer 145A may include a tunneling layer, a charge storage layer, and a blocking layer stacked in order from the channel layer 140. The tunneling layer may tunnel electric charges into the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof.

The channel pad 155 may be disposed only on the upper end of the upper second channel structure CH2. The channel pad 155 may include, for example, doped polycrystalline silicon.

The channel layer 140, the gate dielectric layer 145, and the channel filling insulating layer 150 may be connected to each other between the first channel structure CH1 and the second channel structure CH2. The upper interlayer insulating layer having a relatively great thickness may be disposed between the first channel structure CH1 and the second channel structure CH2. However, the thicknesses and shapes of the interlayer insulating layers 120 and the upper interlayer insulating layer 125 may be varied in the example embodiments.

The second gate dielectric layer 145B may extend along external surfaces of the gate electrodes 130. The second gate dielectric layer 145B may horizontally extend along upper and lower surfaces of the gate electrodes 130, and may cover side surfaces of the gate electrodes 130 facing the channel structure CH and side surfaces of ends of the gate electrodes 130. As illustrated in FIG. 3A, in the pad regions 130P, the second gate dielectric layer 145B may extend to the second pad portion 130P2 and may not extend to the first pad portion 130P1. However, in example embodiments, the second gate dielectric layer 145B may not be provided. In this case, a structure in which the gate electrodes 130 may expand and may be disposed in the regions in which the second gate dielectric layer 145B is disposed may be formed in FIG. 3A.

The contact plugs 170 may be connected to the pad regions 130P of the uppermost gate electrodes 130 in the second region R2. The contact plugs 170 may penetrate at least a portion of the cell region insulating layer 190 and may be connected to each of the pad regions 130P of the gate electrodes 130 exposed upwardly. The contact plugs 170 may penetrate the gate electrodes 130 below the pad regions 130P, may penetrate the horizontal insulating layer 110, the second horizontal conductive layer 104, and the second substrate 101, and may be connected to the circuit interconnection lines 280 disposed in the peripheral circuit region PERI. The contact plugs 170 may be spaced apart from the gate electrodes 130 disposed below the pad regions 130P by the contact insulating layers 160. The contact plugs 170 may be spaced apart from the horizontal insulating layer 110, the second horizontal conductive layer 104, and the second substrate 101 by the substrate insulating layer 121.

The contact plugs 170 may include lower and upper contact plugs disposed on a level corresponding to a level of the first and second channel structures CH1 and CH2, and a bent portion formed by changes in widths may be formed between the lower and upper contact plugs. The contact plugs 170 may have a cylindrical shape of which a width may decrease toward the second substrate 101 due to an aspect ratio. The width of the contact plug 170 may discontinuously change above and below the pad region 130P. As illustrated in FIG. 3A, a second diameter D2 of the contact plug 170 on the lower surface of the first pad portion 130P1 may be smaller than a first diameter D1 of the contact plug 170 on the upper surface of the first pad portion 130P1. The difference between the first diameter D1 and the second diameter D2 may be greater than a difference in consideration of the inclination of the contact plug 170, which may be due to a relative degree of etching between the cell region insulating layer 190 and the interlayer insulating layers 120 when the semiconductor device 100 is manufactured.

As illustrated in FIGS. 3A and 3B, the pad region 130P and the contact insulating layers 160 may be configured to protrude into the contact plug 170 from the interlayer insulating layers 120 around the contact plug 170. The pad region 130P and the contact insulating layers 160 may horizontally protrude toward the contact plug 170. Accordingly, the external surface of the contact plug 170 may have protrusions corresponding to the interlayer insulating layers 120 and protruding to an external side. The contact plug 170 may be in contact with a portion of the upper surface, the side surface, and/or a portion of the lower surface of the protruding pad region 130P, and may be in contact with a portion of the upper surface, the side surface, and/or a portion of the lower surface of each of the protruding contact insulating layers 160.

The contact plugs 170 may include a conductive material, such as, for example, at least one of tungsten (W), copper (Cu), aluminum (Al), and/or alloys thereof. In some example embodiments, the contact plugs 170 may have an air gap therein. The contact plugs 170 may be disposed to penetrate the gate electrodes 130 and may be self-aligned in the pad regions 130P, and may be in contact with the upper surface, the side surface, and/or the lower surface of the pad region 130P, such that contact area may be secured.

The contact insulating layers 160 may be disposed to surround side surfaces of the contact plugs 170 below the pad regions 130P in a plan view. The contact insulating layers 160 may be disposed on the same level as a level of the gate electrodes 130, and may be disposed such that side surfaces of the contact insulating layers 160 may be in contact with the gate electrodes 130. The thickness of the contact insulating layer 160 may be substantially the same as the sum of the thickness of the gate electrodes 130 and the thickness of the second gate dielectric layers 145B on the upper and lower surfaces of the gate electrodes 130. The contact insulating layers 160 may be spaced apart from each other in the Z-direction by the interlayer insulating layers 120. The contact insulating layers 160 may be spaced apart from each other even between the contact plugs 170 adjacent to each other.

As illustrated in FIG. 3B, internal side surfaces of the contact insulating layers 160 may surround the contact plugs 170, and external side surfaces of the contact insulating layers 160 may be surrounded by gate electrodes 130. The contact plugs 170 may be physically and electrically connected to a single gate electrode 130 in the pad region 130P by the contact insulating layers 160, and may be electrically separated from the gate electrodes 130 disposed therebelow.

The contact insulating layers 160 may include an insulating material, and may include a material different from that of the interlayer insulating layer 120. The contact insulating layers 160 may include, for example, at least one of silicon nitride and silicon oxynitride.

The substrate contact 175 may be connected to the second substrate 101 on the external side of the gate electrodes 130. A lower end of the substrate contact 175 may be disposed in the second substrate 101.

The through-vias 180 may be disposed in the third region R3, may penetrate the memory cell region CELL, and may extend to the peripheral circuit region PERI. The through-vias 180 may connect the upper interconnections 185 of the memory cell region CELL to the circuit interconnection lines 280 of the peripheral circuit region PERI. The through-vias 180 may penetrate the stack structure of the sacrificial insulating layers 118 and the interlayer insulating layers 120 in a region in which the sacrificial insulating layers 118 remain without being replaced with the gate electrodes 130.

As illustrated in FIG. 4, the sacrificial insulating layers 118 may have a shape protruding toward the through-via 180 further than the interlayer insulating layers 120 around the through-via 180. Accordingly, the external surface of the through-via 180 may have protrusions corresponding to the interlayer insulating layers 120. However, in example embodiments, the degree of protrusion of the sacrificial insulating layers 118 may be varied.

Similar to the contact plugs 170, the substrate contacts 175 and/or the through-vias 180 may also have bent portions on a level corresponding to the boundary between the first and second channel structures CH1 and CH2.

The substrate contacts 175 and the through-vias 180 may be formed in the same process as the process of forming the contact plugs 170 and may include the same material. compared to the material of the substrate contacts 175 and the through-vias 180, the material of the contact plugs 170 described above may be similar to or different.

The upper interconnections 185 may form a cell interconnection structure electrically connected to memory cells in the memory cell structure CELL. The upper interconnections 185 may be connected to the channel structures CH, the contact plugs 170, the substrate contact 175, and the through-vias 180, and may be electrically connected to the channel structures CH and the gate electrodes 130. In FIGS. 2A and 2B, the upper interconnections 185 are illustrated in the form of plugs, but example embodiments thereof is not limited thereto, and the upper interconnections 185 may have a line form. In example embodiments, the number of plugs and interconnection lines included in the cell interconnection structure may be varied. The upper interconnections 185 may include a metal, such as, for example, tungsten (W), copper (Cu), and/or aluminum (Al).

The cell region insulating layer 190 may be disposed to cover or overlap the second substrate 101, the gate electrodes 130 on the second substrate 101, and/or the peripheral region insulating layer 290. The cell region insulating layer 190 may be formed of an insulating material, or may include a plurality of insulating layers.

Figure 5A:
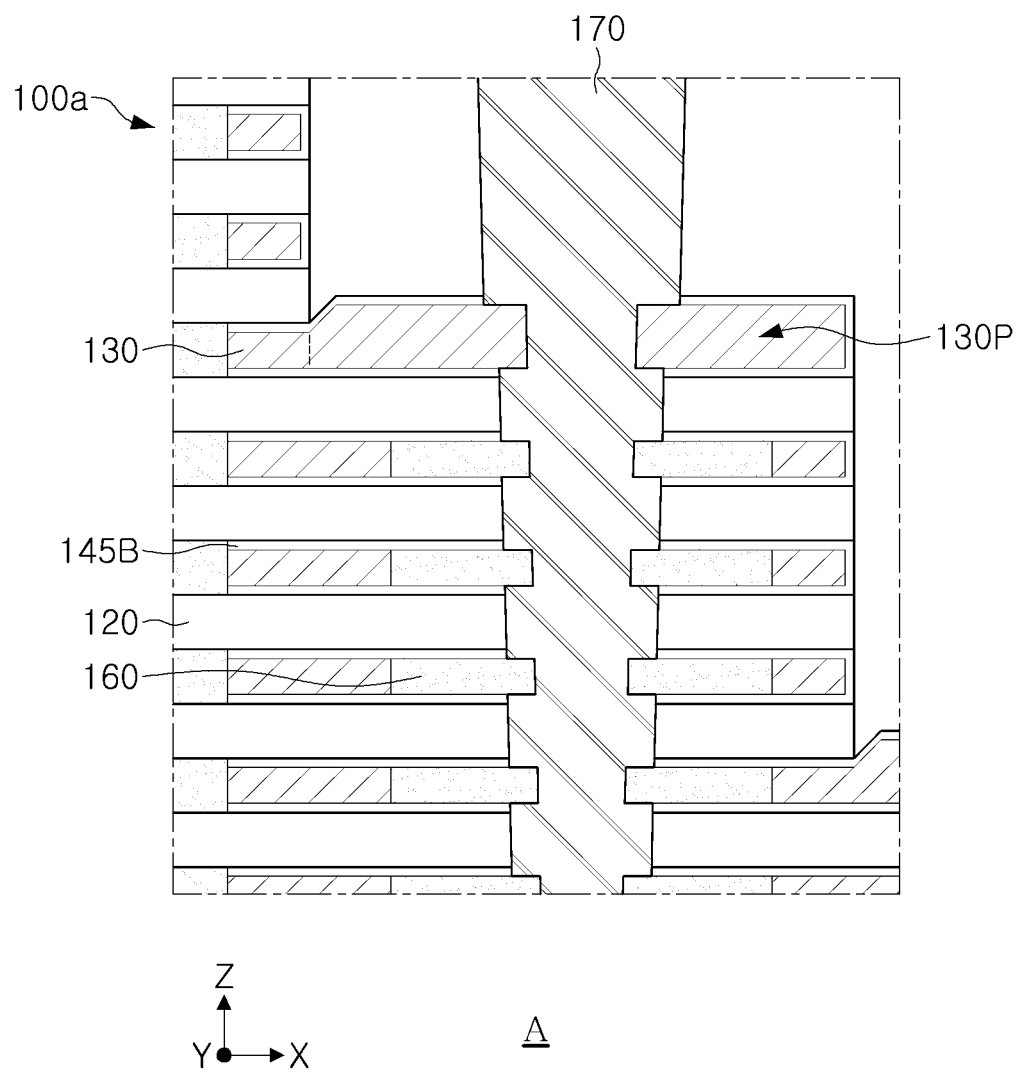
FIGS. 5A to 5C are enlarged view illustrating a portion of a semiconductor device according to example embodiments of the present disclosure.
Figure 5B:
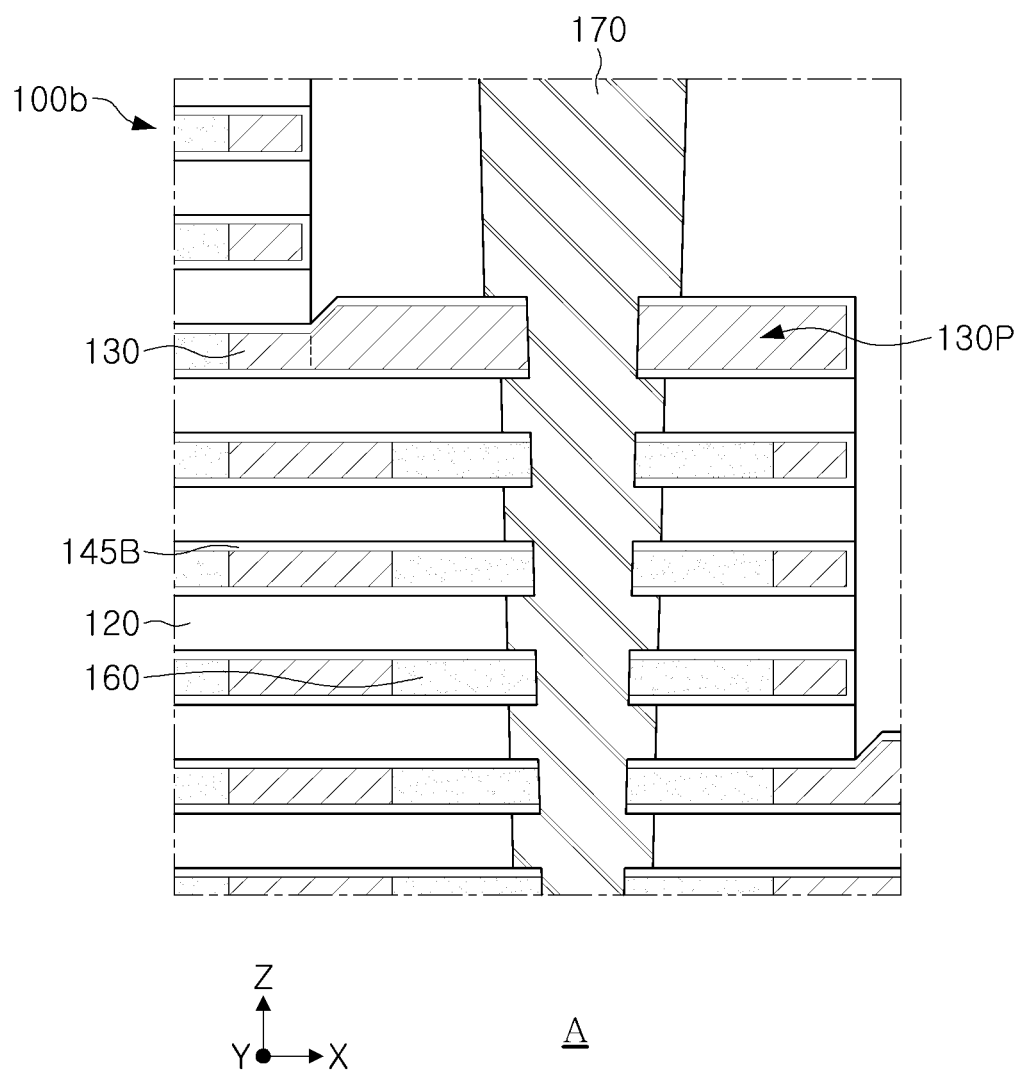
Figure 5C:
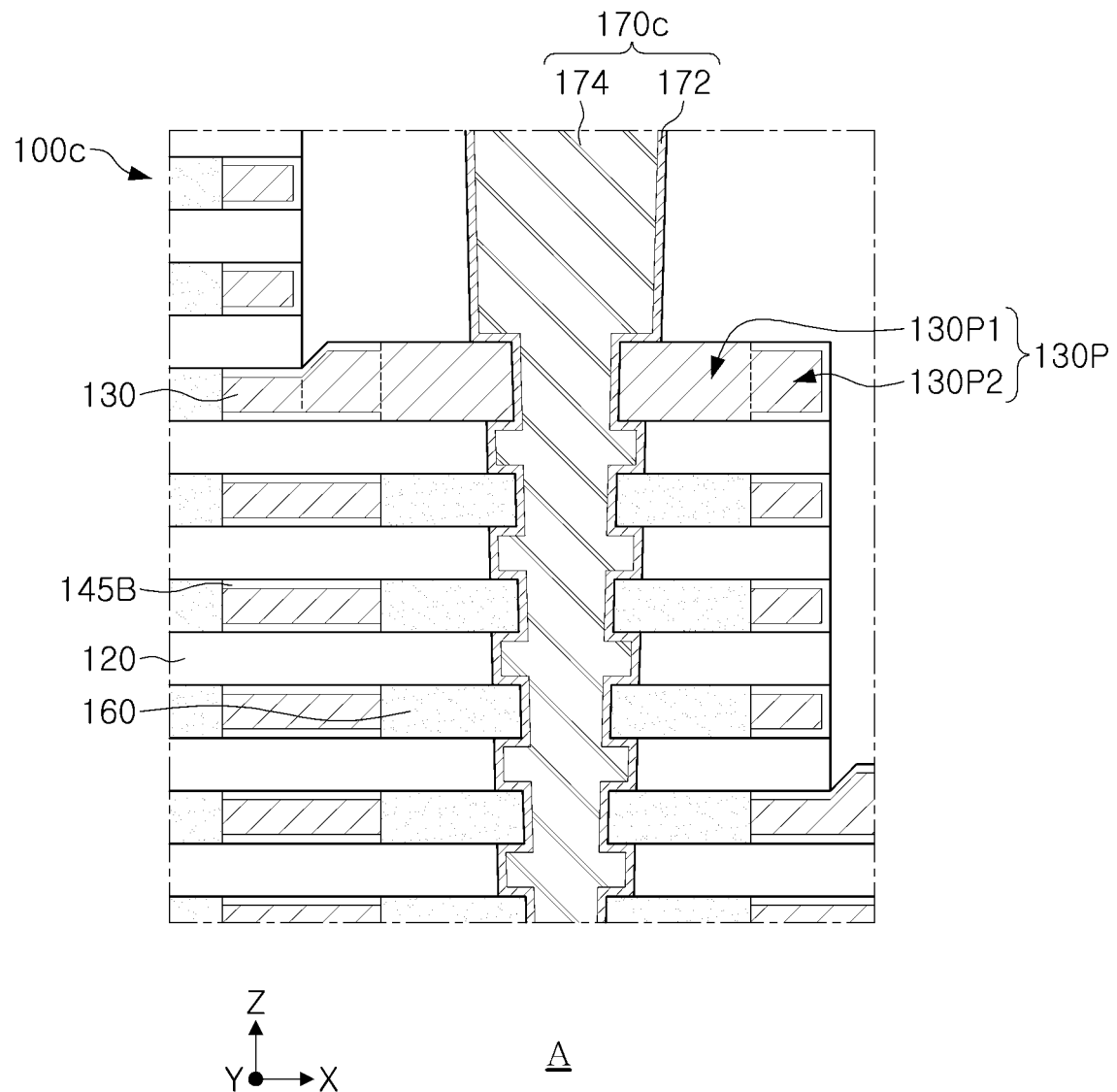

FIGS. 5A to 5C are enlarged view illustrating a portion of a semiconductor device according to example embodiments, illustrating region corresponding to FIG. 3A.

Referring to FIG. 5A, in a semiconductor device 100a, the shape of the second gate dielectric layer 145B may be different from the example in FIG. 3A in the region adjacent to the contact plug 170. In example embodiments, the second gate dielectric layer 145B may further extend to the upper and lower surfaces of the pad region 130P corresponding to a portion of the first pad portion 130P1 in FIG. 3A. However, in the region in contact with the contact plug 170, the second gate dielectric layer 145B may be removed and may not be disposed on the upper surface, the side surface, and the lower surface of the pad region 130P.

This structure may be manufactured by not removing the second gate dielectric layer 145B from the upper and lower surfaces of the gate electrode 130 during the process described with reference to FIG. 11I below, and by removing the second gate dielectric layer 145B before the contact plugs 170 is formed in a subsequent process, for example.

Referring to FIG. 5B, in a semiconductor device 100b, the shape of the second gate dielectric layer 145B in the region adjacent to the contact plug 170 may be different from the examples in FIGS. 3A and 5A. In example embodiments, the second gate dielectric layer 145B may further extend to the upper and lower surfaces of the pad region 130P corresponding to the first pad portion 130P1 in FIG. 3A and may expose only the side surfaces of the pad region 130P. That is, the second gate dielectric layer 145B may cover the upper and lower surfaces of the pad region 130P even in a region overlapping the contact plug 170.

This structure may be manufactured by not performing the process of removing the second gate dielectric layer 145B from the upper and lower surfaces of the gate electrode 130 among the processes described with reference to FIG. 11I below.

Referring to FIG. 5C, in a semiconductor device 100c, the contact plug 170c may further include a barrier layer 172 on sidewalls and a bottom surface of the contact hole in which the contact plug 170c is disposed. A layer filling the contact hole on the barrier layer 172 may be referred to as a contact conductive layer 174. The barrier layer 172 may include, for example, at least one of titanium (Ti), titanium nitride (TiN), tantalum (Ta), and/or tantalum nitride (TaN). The contact conductive layer 174 may include, for example, at least one of tungsten (W), copper (Cu), aluminum (Al), and/or alloys thereof. In this case, similarly to the contact plugs 170c, the substrate contacts 175 and the through-vias 180 in FIG. 2A may include a barrier layer and a conductive layer. The structure of the contact plug 170c may be applied to other example embodiments.

Figure 6A:
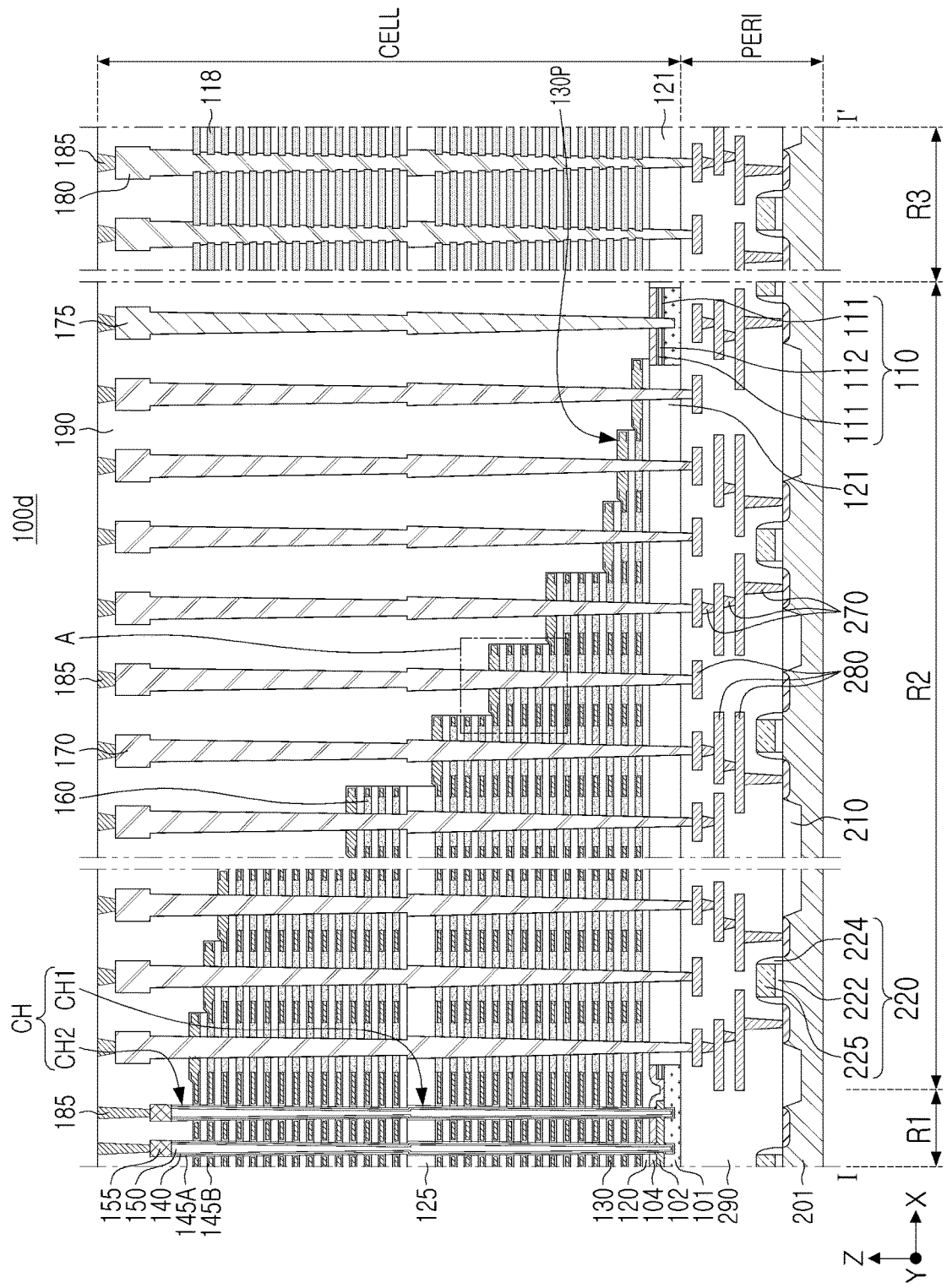
FIGS. 6A and 6B are a cross-sectional view illustrating a semiconductor device and an enlarged view illustrating a portion of a semiconductor device according to example embodiments of the present disclosure.
Figure 6B:
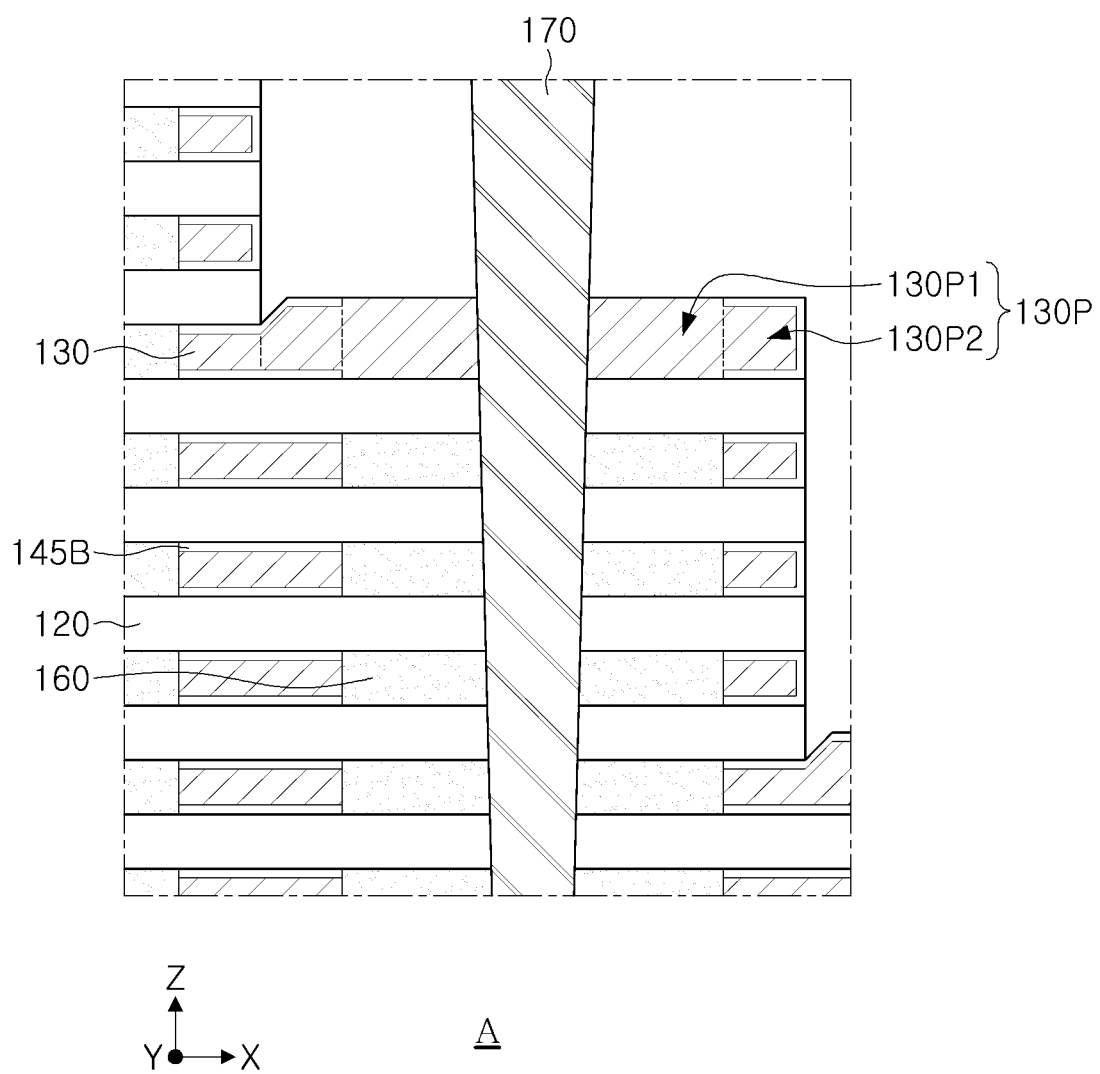

FIGS. 6A and 6B are a cross-sectional view illustrating a semiconductor device and an enlarged view illustrating a portion of a semiconductor device according to example embodiments. FIG. 6A illustrating a region corresponding to FIG. 2A, and FIG. 6B illustrates a region corresponding to FIG. 3A.

Referring to FIGS. 6A and 6B, in a semiconductor device 100d, the pad region 130P and the contact insulating layers 160 may not protrude toward the contact plug 170. Accordingly, the pad region 130P may be connected to the contact plug 170 only through the side surface. The side surface of the pad region 130P, the side surfaces of the contact insulating layers 160, and the side surfaces of the interlayer insulating layers 120, that are in contact with the contact plug 170, may be disposed on a linear line perpendicular to the Z-direction or inclined along the Z-direction. Also, in the contact plug 170, the width on the upper surface and the width on the lower surface of the pad region 130P may be the same or may have only a difference according to an inclination.

This structure may be manufactured by not performing the processes described with reference to FIGS. 11M and 11N below, or alternatively, by not performing the processes described with reference to FIGS. 11L to 11N below and forming the pad region 130P together while forming the contact plug 170 described with reference to FIG. 11O. Accordingly, the process of manufacturing the semiconductor device 100d may be simplified. In the latter example, since the contact plug 170 and the first pad portion 130P1 are formed together, the interfacial surface therebetween may not be distinct, and only the interfacial surface between the first pad portion 130P1 and the second pad portion 130P2 may be distinct.

Figure 7:
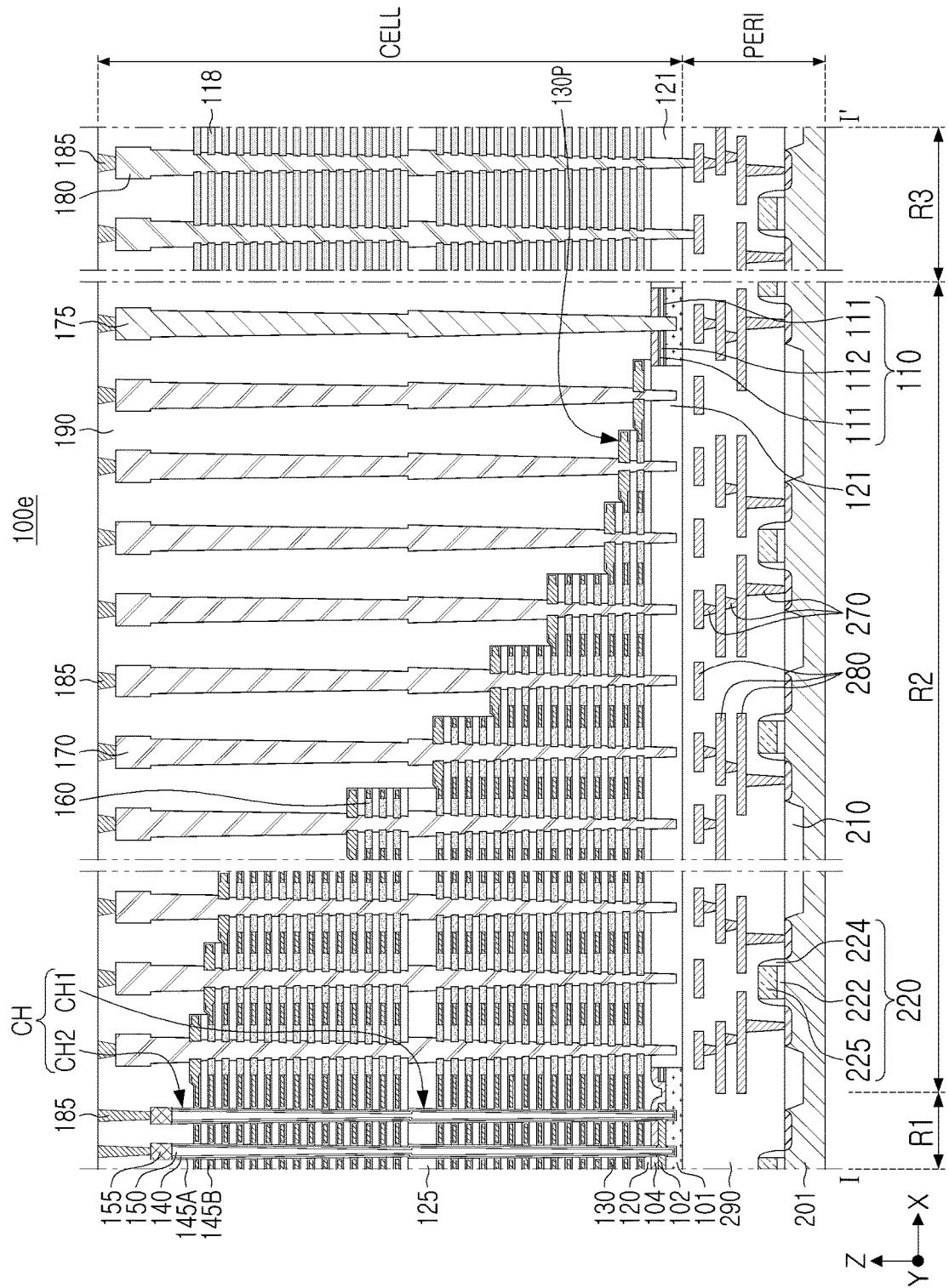
FIG. 7 is a cross-sectional view illustrating a semiconductor device according to example embodiments of the present disclosure.

FIG. 7 is a cross-sectional view illustrating a semiconductor device according to example embodiments, a cross-sectional view corresponding to FIG. 2A.

Referring to FIG. 7, in a semiconductor device 100e, the contact plugs 170 may not extend into the peripheral circuit region PERI, and lower ends of the contact plugs 170 may be disposed in the substrate insulating layer 121.

In some example embodiments, lower ends of the contact plugs 170 may be disposed on the upper surface of the substrate insulating layer 121. In some example embodiments, lower ends of the contact plugs 170 may not be disposed in the substrate insulating layer 121 and may be disposed in the second substrate 101 in which the substrate insulating layer 121 is not formed. In this case, the second substrate 101 may be divided into a plurality of portions such that the contact plugs 170 are not electrically connected to each other in the second region R2. In some embodiments, the lower ends of the contact plugs 170 may be disposed in an insulating region in the second substrate 101 extending from the upper surface of the second substrate 101.

In example embodiments, the contact plugs 170 may be electrically connected to the circuit devices 220 of the peripheral circuit region PERI through the upper interconnection structure including the upper interconnections 185 and the through-vias 180.

Figure 8:
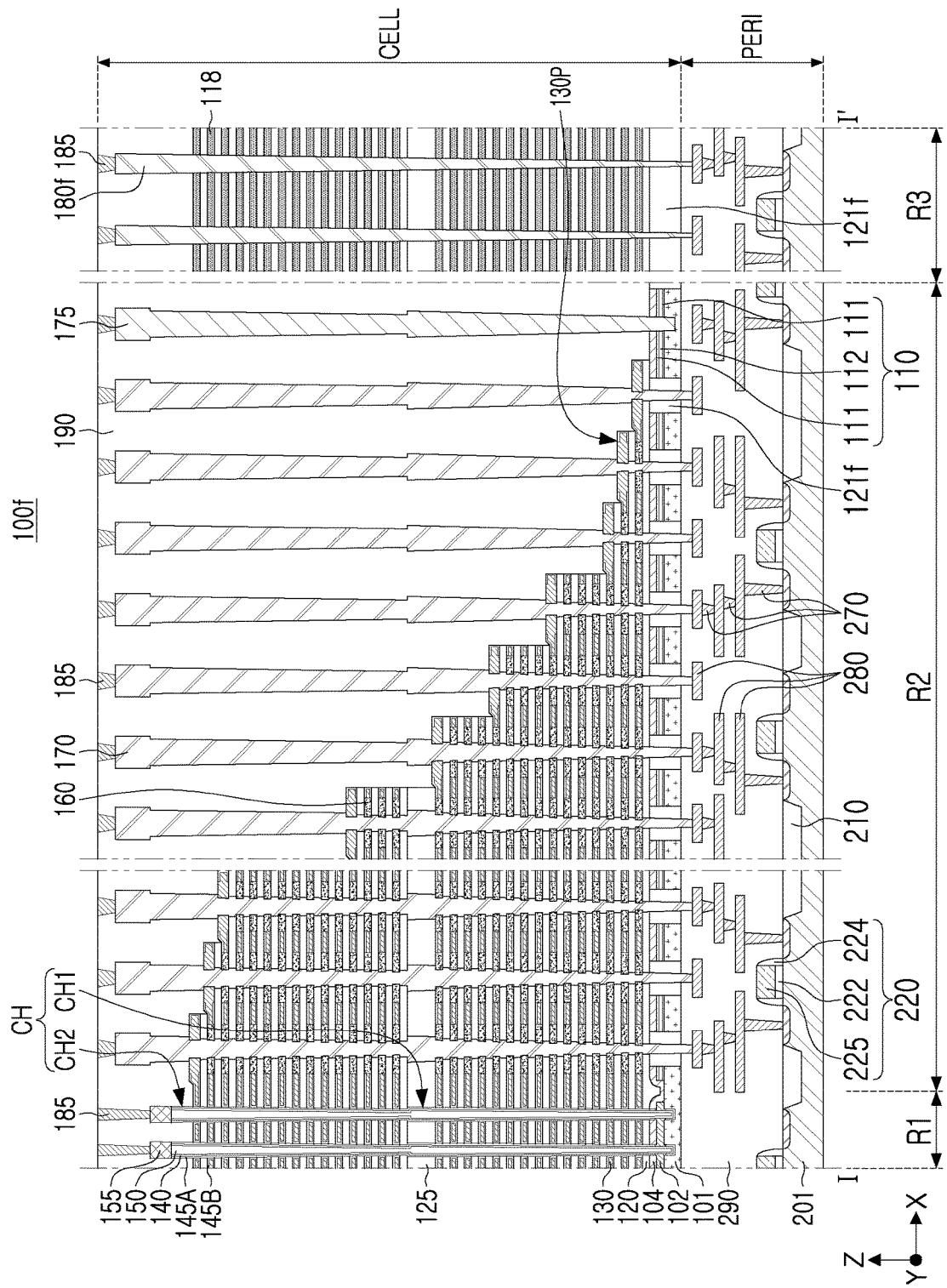
FIG. 8 is a cross-sectional view illustrating a semiconductor device according to example embodiments of the present disclosure.

FIG. 8 is a cross-sectional view illustrating a semiconductor device according to example embodiments, a cross-sectional view corresponding to FIG. 2A.

Referring to FIG. 8, in a semiconductor device 100f, the through-vias 180f and the substrate insulating layers 121f may have shapes and/or structures different from those of the example embodiments in FIGS. 2A and 4.

Specifically, the through-vias 180f may be disposed to penetrate the sacrificial insulating layers 118 and the interlayer insulating layers 120 without protrusions disposed on the side surface. Also, the through-vias 180f may not include the bent portion on a level corresponding to a level of the boundary between the first and second channel structures CH1 and CH2. The internal structures and materials of the through-vias 180f may be the same as, similar to, or different from those of the contact plugs 170. The structure of the through-vias 180f may be formed as the through-vias 180f are formed separately from the contact plugs 170 in a different process. In example embodiments, the substrate contact 175 may also have a shape different from that of the contact plugs 170.

The substrate insulating layers 121f may be spaced apart from each other to surround the contact plugs 170 in a plan view in the second region R2, respectively. The substrate insulating layers 121f may be disposed to surround the side surface of each of the contact plugs 170 in a plan view.

These structures of the through-vias 180f and the substrate insulating layers 121f may be applied independently of each other in example embodiments, and may be applied independently of each other in in the other example embodiments.

Figure 9:
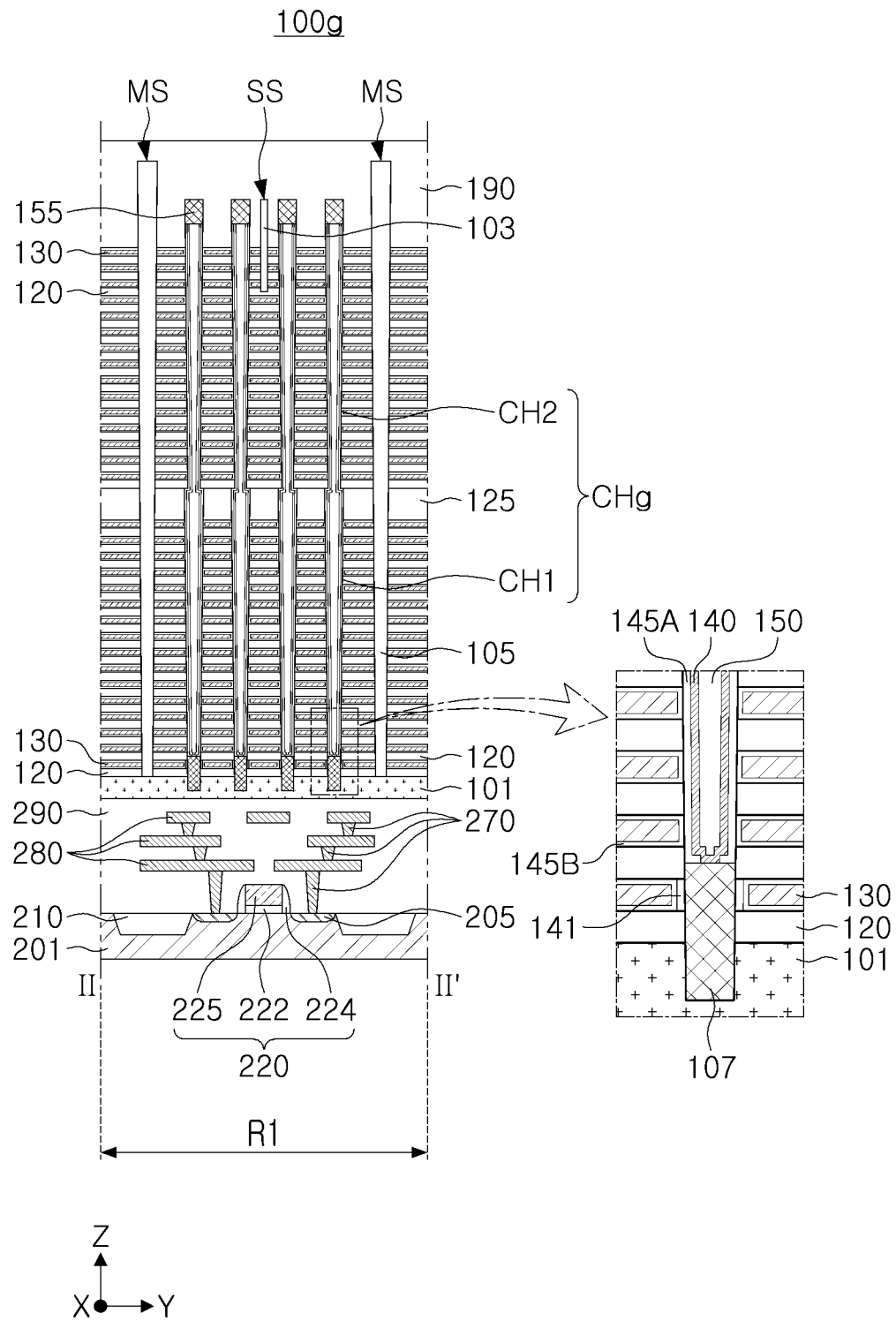
FIG. 9 is a cross-sectional view illustrating a semiconductor device according to example embodiments of the present disclosure.

FIG. 9 is a cross-sectional view illustrating a semiconductor device according to example embodiments, illustrating a region corresponding to FIG. 2B.

Referring to FIG. 9, in a semiconductor device 100g, the memory cell structure CELL may not include first and second horizontal conductive layers 102 and 104 on the second substrate 101, differently from the example embodiment in FIGS. 2A and 2B. Accordingly, the substrate insulating layer 121 may penetrate the second substrate 101 in the second region R2. Also, the channel structure CHg may further include an epitaxial layer 107.

The epitaxial layer 107 may be disposed on the second substrate 101 on the lower end of the channel structure CHg, and may be disposed on a side surface of the at least one of the gate electrodes 130. The epitaxial layer 107 may be disposed in the recessed region of the second substrate 101. The level of the lower surface of the epitaxial layer 107 may be higher than the level of the upper surface of the lowermost gate electrode 130 and may be lower than the level of the lower surface of the gate electrode 130 disposed above the lowermost gate electrode 130, but example embodiments thereof are not limited thereto. The epitaxial layer 107 may be connected to the channel layer 140 through the upper surface of the epitaxial layer 107. A gate insulating layer 141 may be further disposed between the epitaxial layer 107 and the lowermost gate electrode 130.

Figure 10:
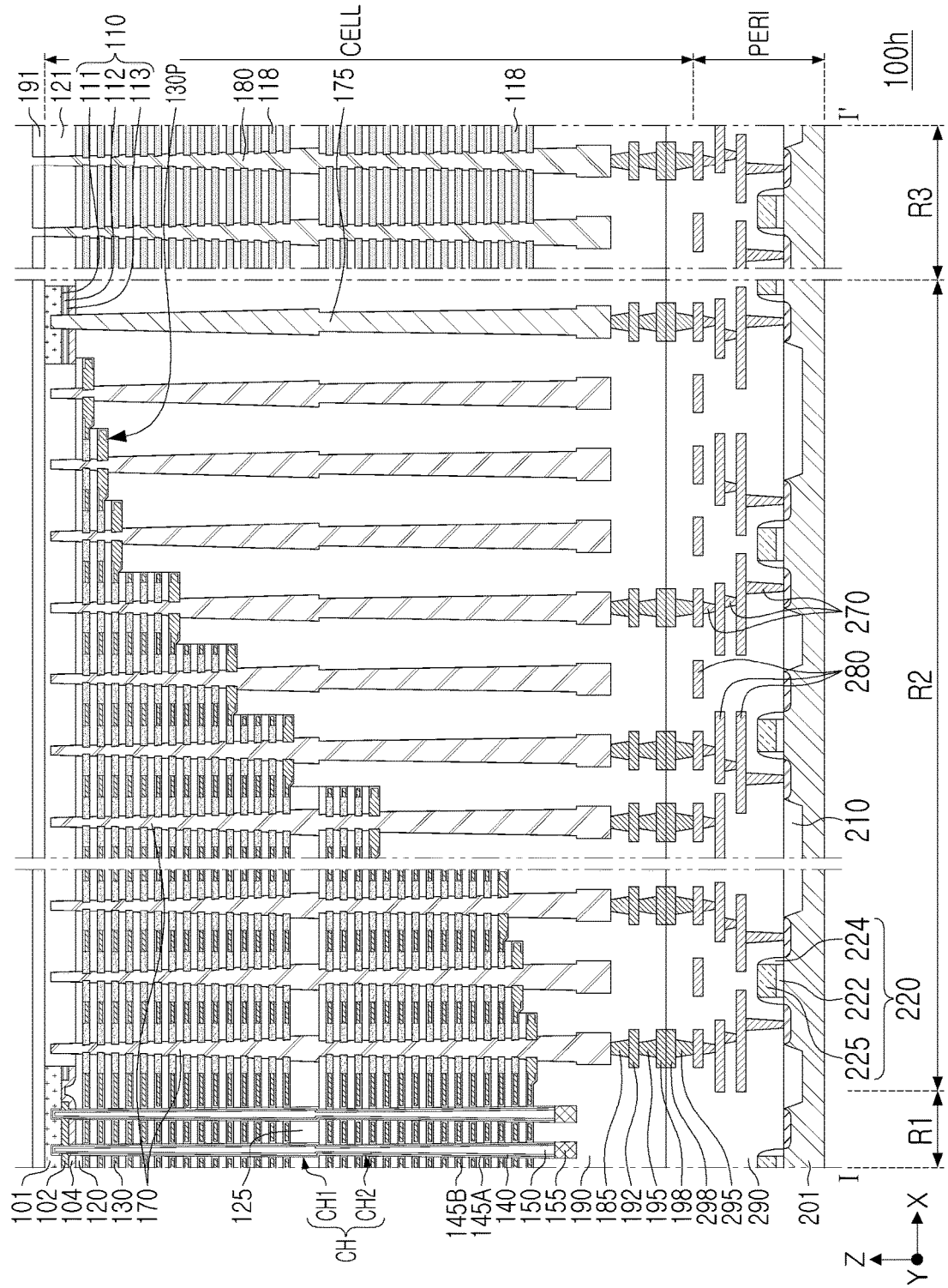
FIG. 10 is a cross-sectional view illustrating a semiconductor device according to example embodiments of the present disclosure.

FIG. 10 is a cross-sectional view illustrating a semiconductor device according to example embodiments, a cross-sectional view corresponding to FIG. 2A.

Referring to FIG. 10, a semiconductor device 100h may have a structure in which the peripheral circuit region PERI and the memory cell region CELL are vertically bonded to each other using a wafer bonding method. To this end, the peripheral circuit region PERI may further include first bonding vias 295 and first bonding pads 298, and the memory cell region CELL may include the cell interconnection lines 192, the second bonding vias 195, the second bonding pads 198, and a passivation layer 191 on the second substrate 101.

The first bonding vias 295 may be disposed above the uppermost circuit interconnection lines 280 and may be connected to the circuit interconnection lines 280. At least a portion of the first bonding pads 298 may be connected to the first bonding vias 295 on the first bonding vias 295. The first bonding pads 298 may be connected to the second bonding pads 198 of the memory cell region CELL. The first bonding pads 298 may provide an electrical connection path according to bonding of the peripheral circuit region PERI to the memory cell region CELL together with the second bonding pads 198. The first bonding vias 295 and the first bonding pads 298 may include a conductive material, such as, for example, copper (Cu).

The cell interconnection lines 192 may be disposed below the upper interconnections 185 and may be connected to the second bonding vias 195. The cell interconnection lines 192 may be formed of a conductive material, and may include, for example, at least one of tungsten (W), aluminum (Al), and/or copper (Cu).

The second bonding vias 195 and the second bonding pads 198 may be disposed below the lowermost cell interconnection lines 192. The second bonding vias 195 may connect the cell interconnection lines 192 to the second bonding pads 198, and the second bonding pads 198 may be bonded to the first bonding pads 298 of the peripheral circuit region PERI. The second bonding vias 195 and the second bonding pads 198 may include a conductive material, such as, for example, copper (Cu).

The peripheral circuit region PERI and the memory cell region CELL may form a semiconductor structure, and may be bonded by copper (Cu)-to-copper (Cu) bonding by the first bonding pads 298 and the second bonding pads 198. In addition to the copper (Cu)-to-copper (Cu) bonding, the peripheral circuit region PERI and the memory cell region CELL may be further bonded by dielectric-to-dielectric bonding. The dielectric-to-dielectric bonding may be bonded by dielectric layers forming a portion of each of the peripheral region insulating layer 290 and the cell region insulating layer 190 and surrounding each of the first bonding pads 298 and the second bonding pads 198. Accordingly, the peripheral circuit region PERI and the memory cell region CELL may be bonded to each other without an adhesive layer.

Figure 11A:
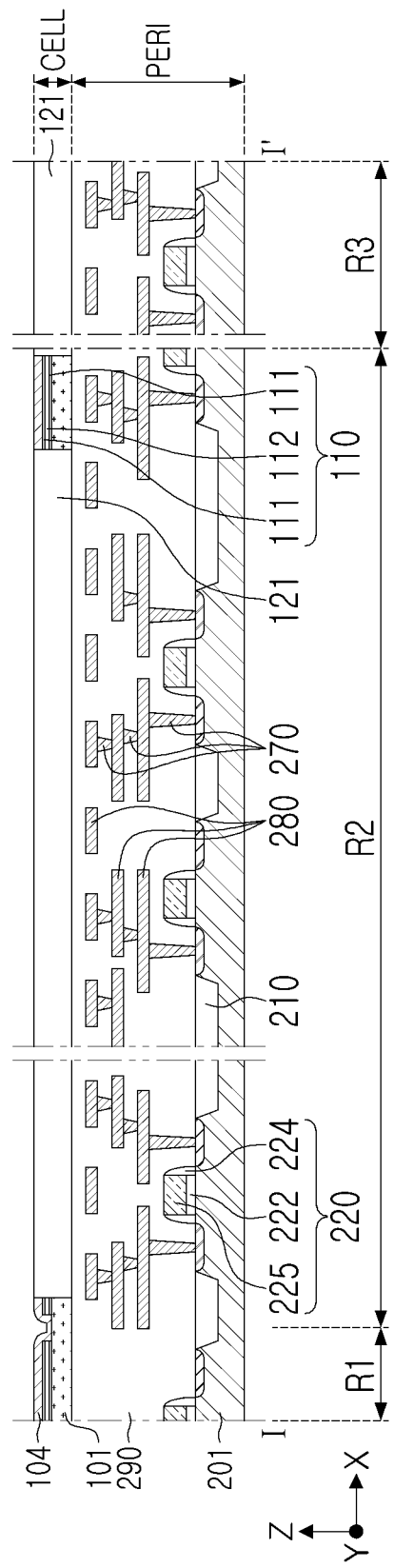
FIGS. 11A to 11O are cross-sectional views illustrating a method of manufacturing a semiconductor device according to example embodiments of the present disclosure.
Figure 11B:
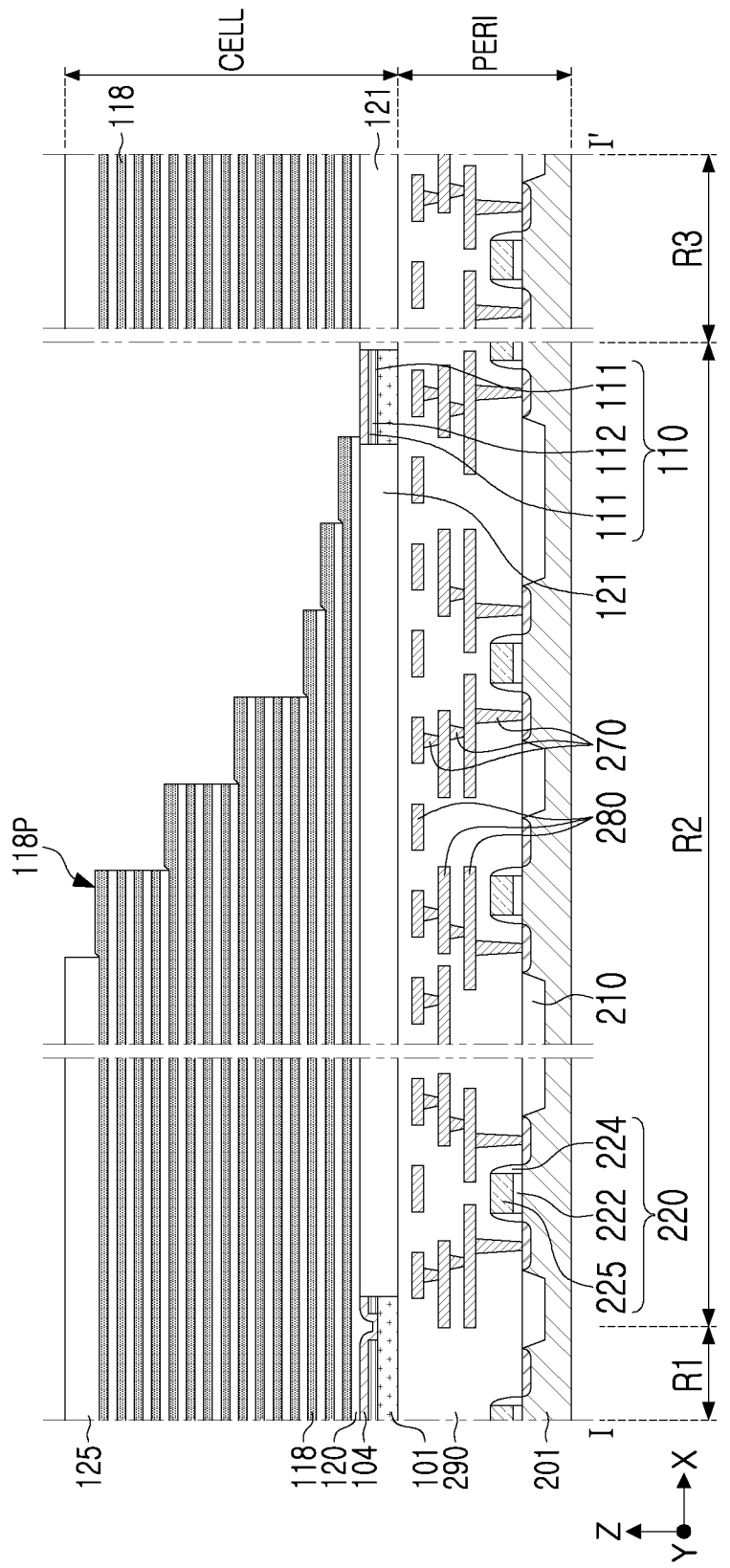
Figure 11C:
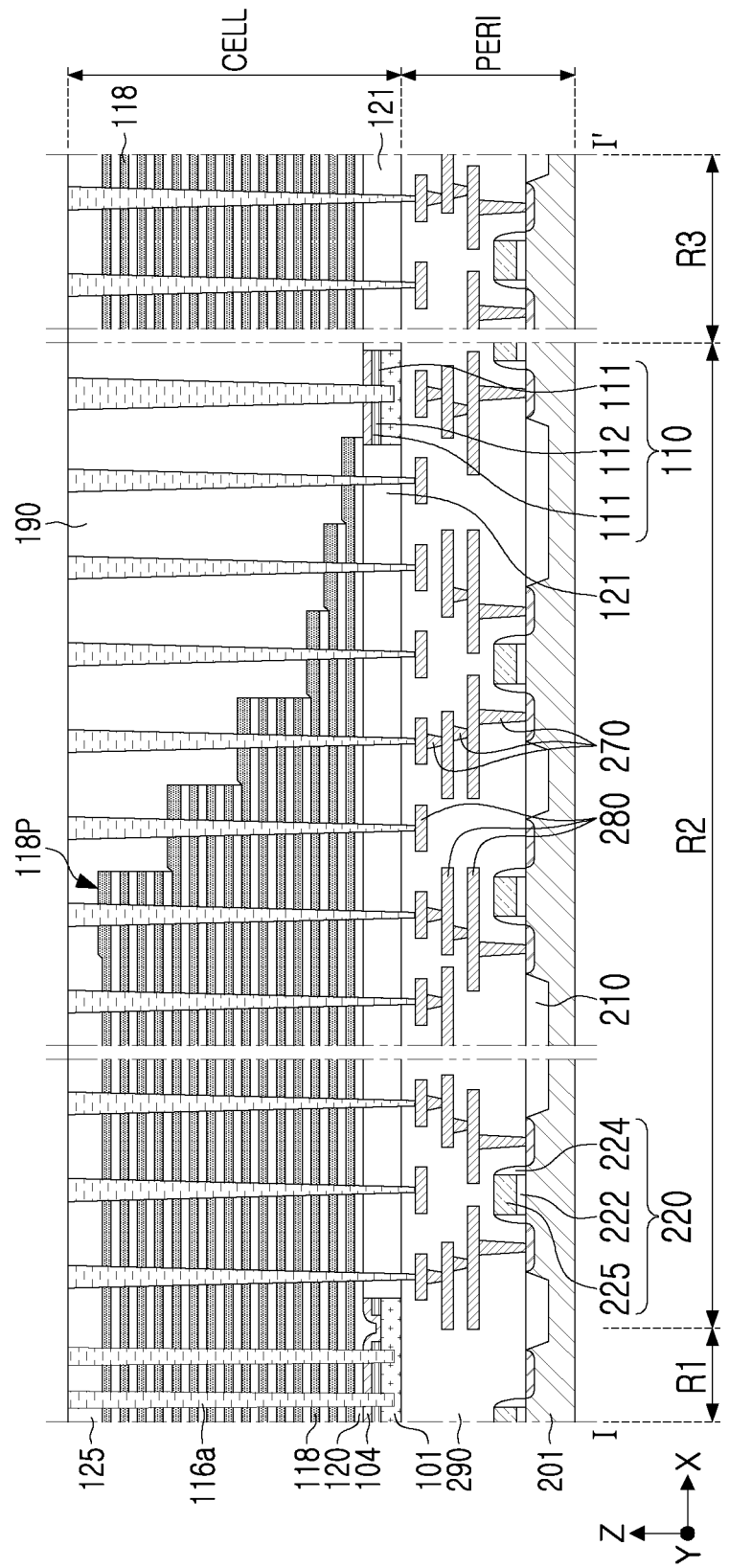
Figure 11D:
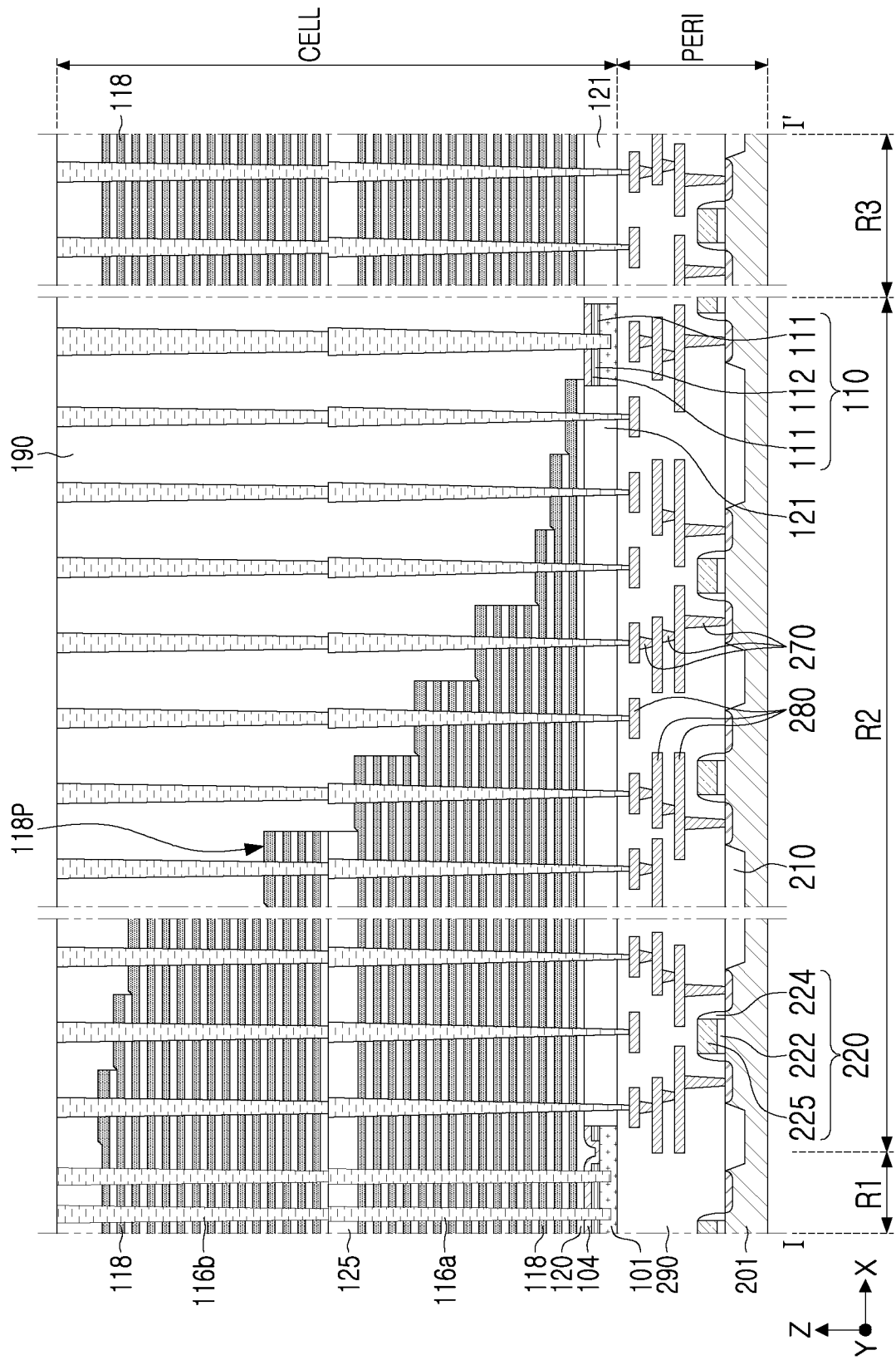
Figure 11E:
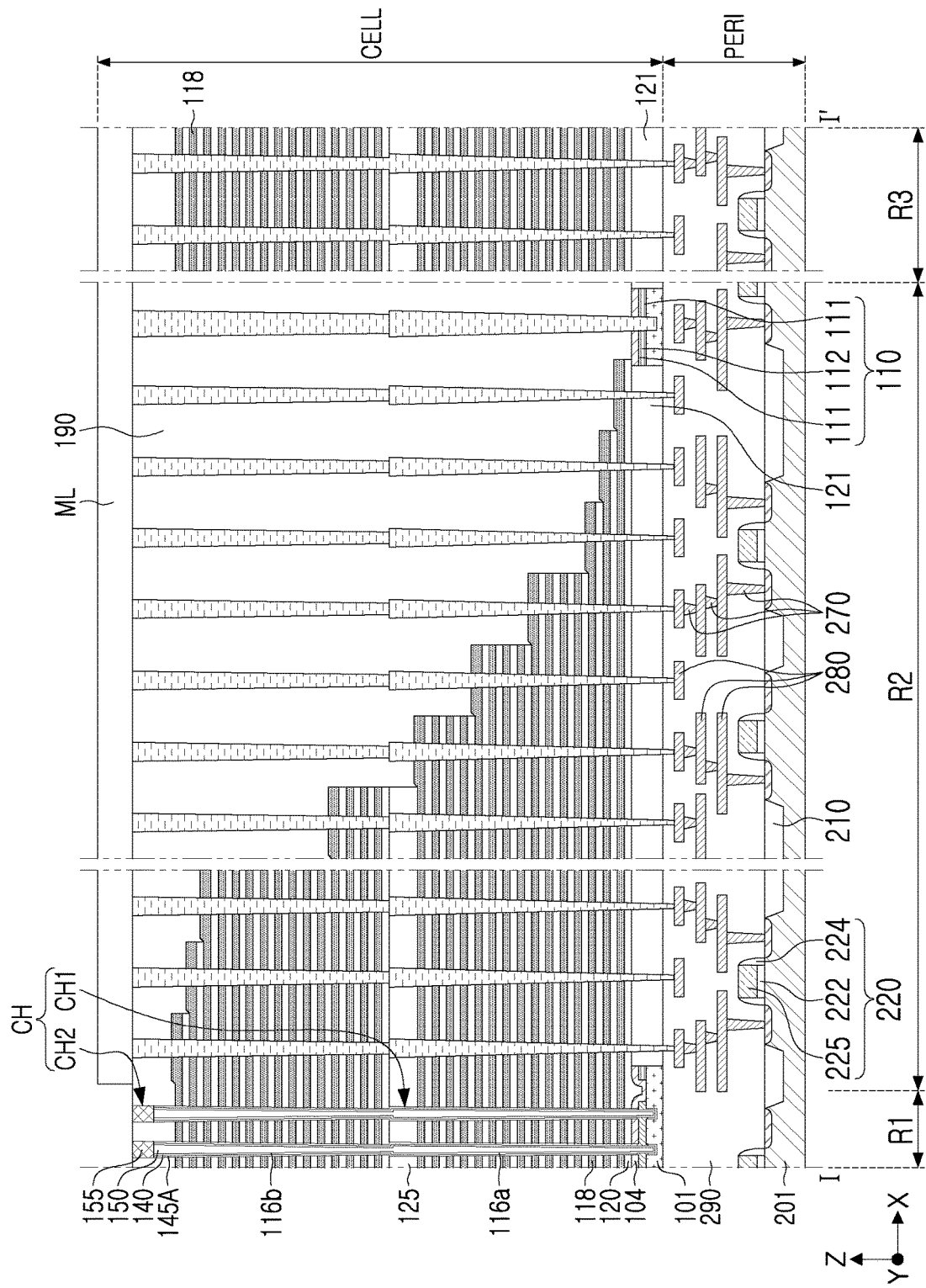
Figure 11F:
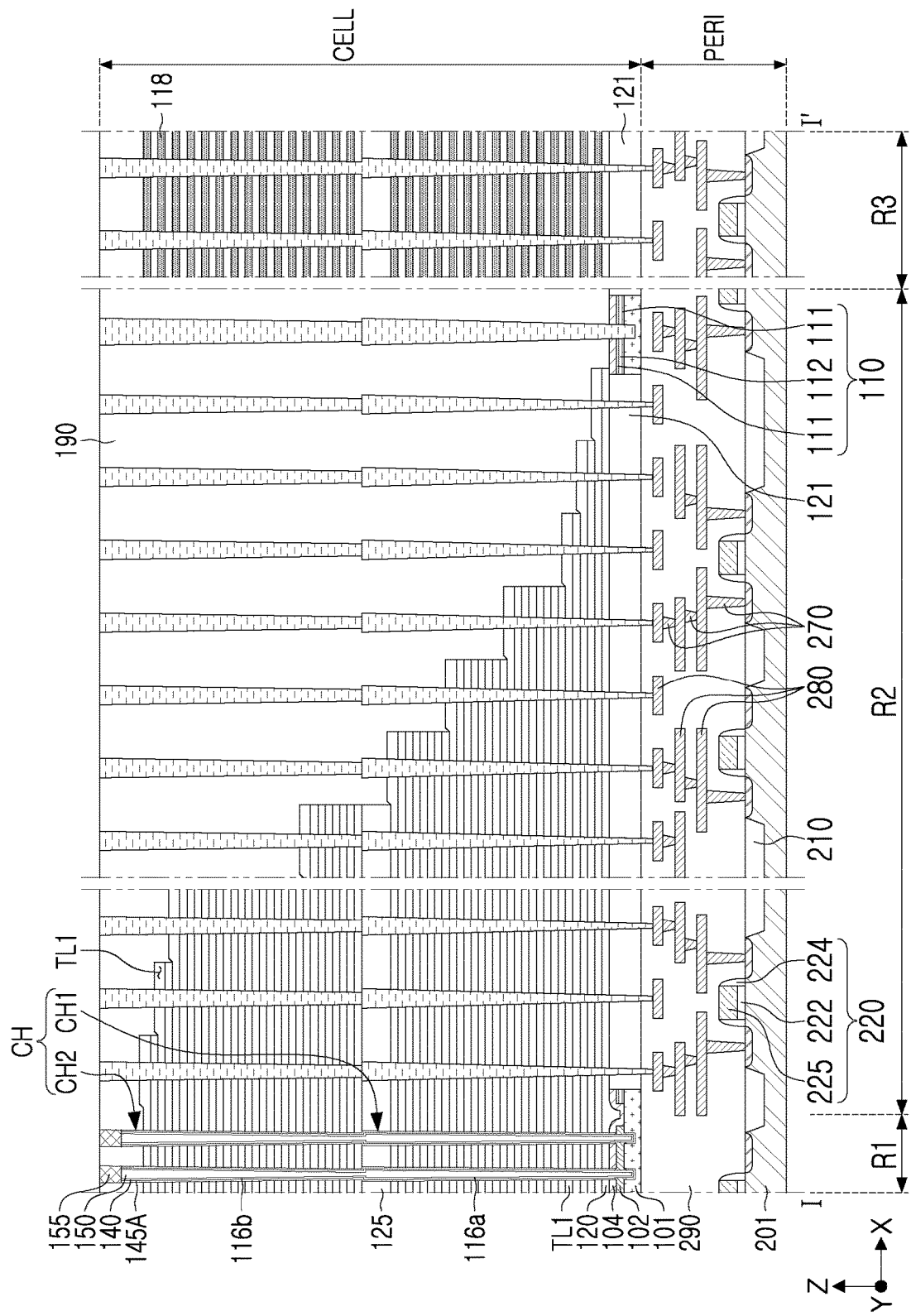
Figure 11G:
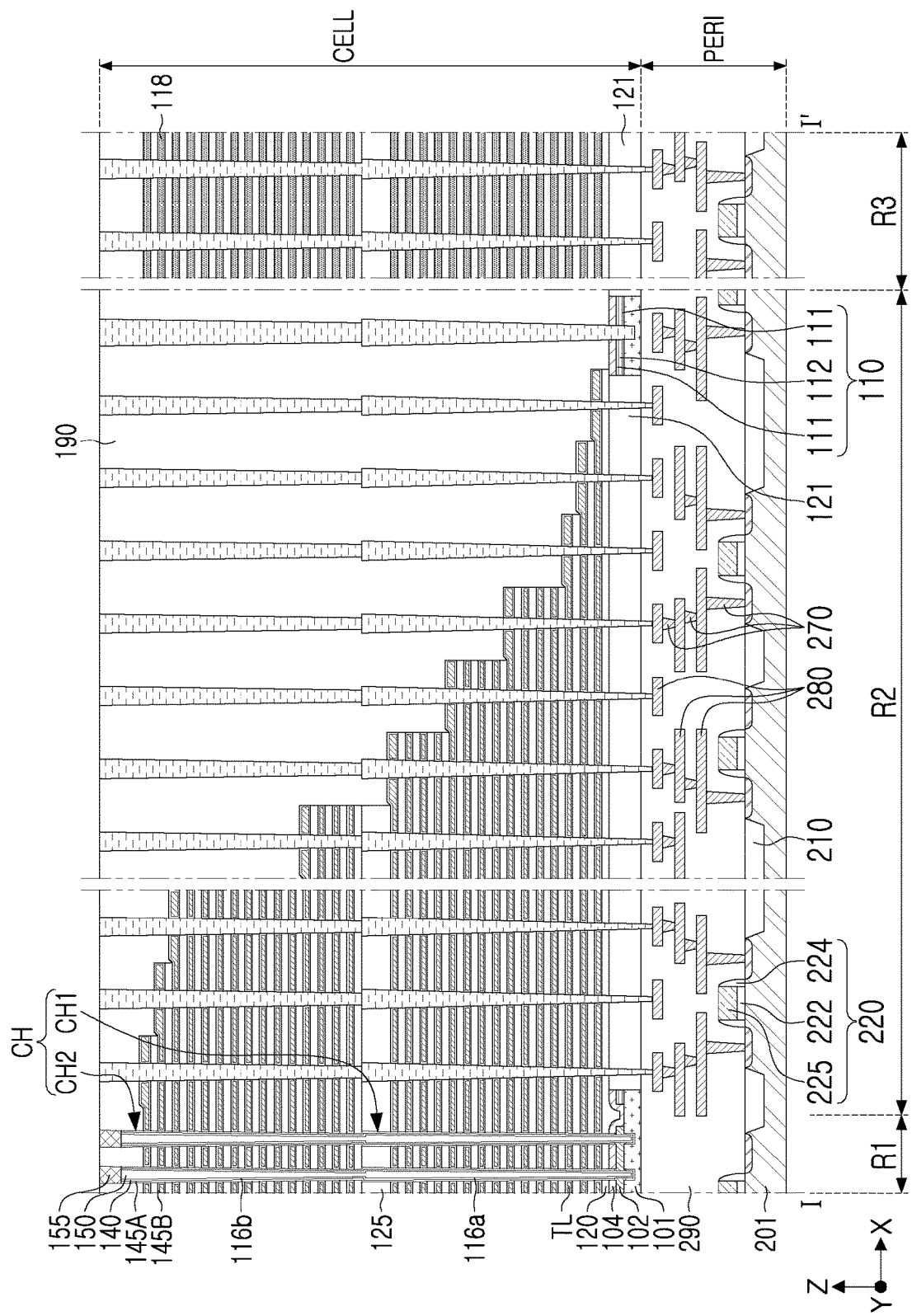
Figure 11H:
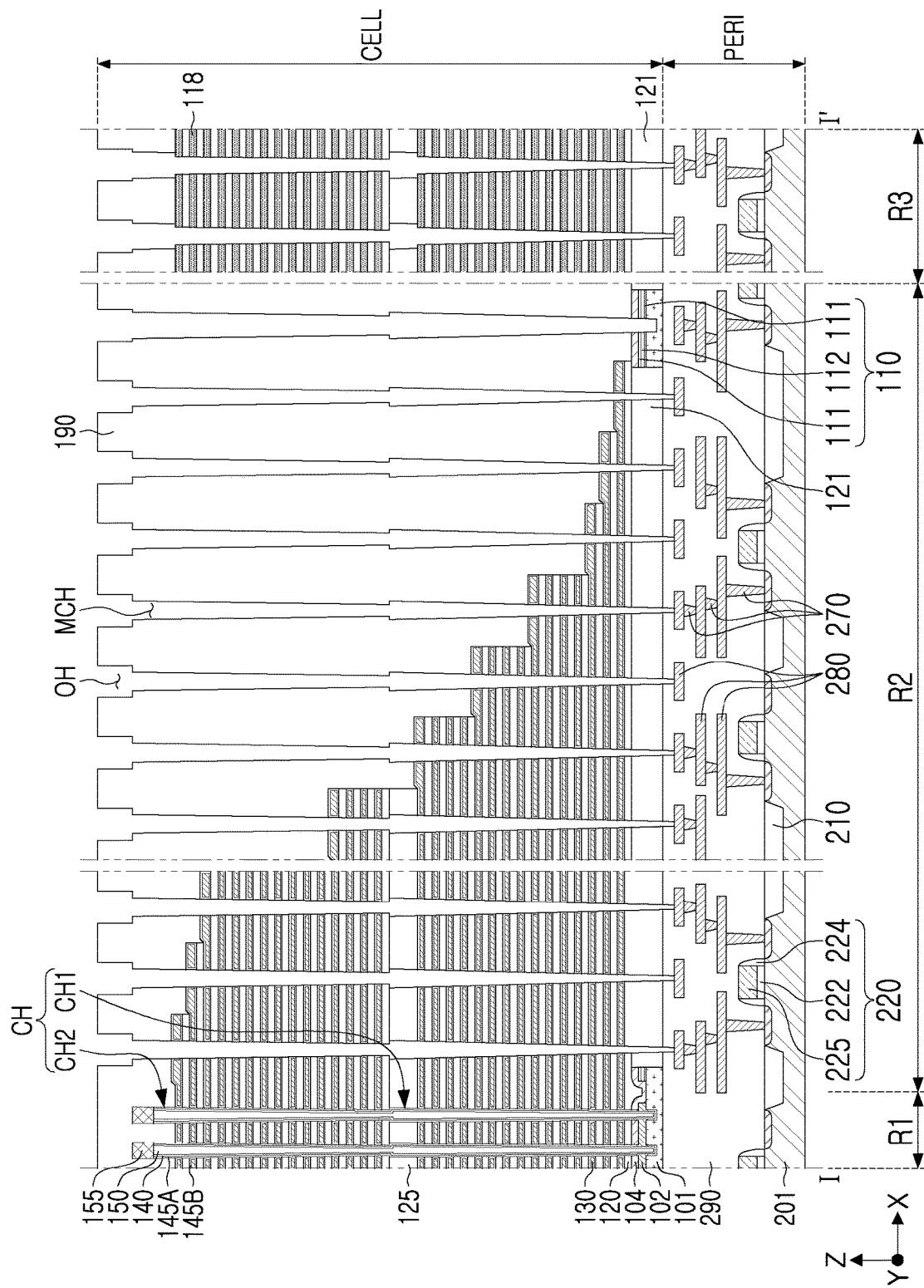
Figure 11I:
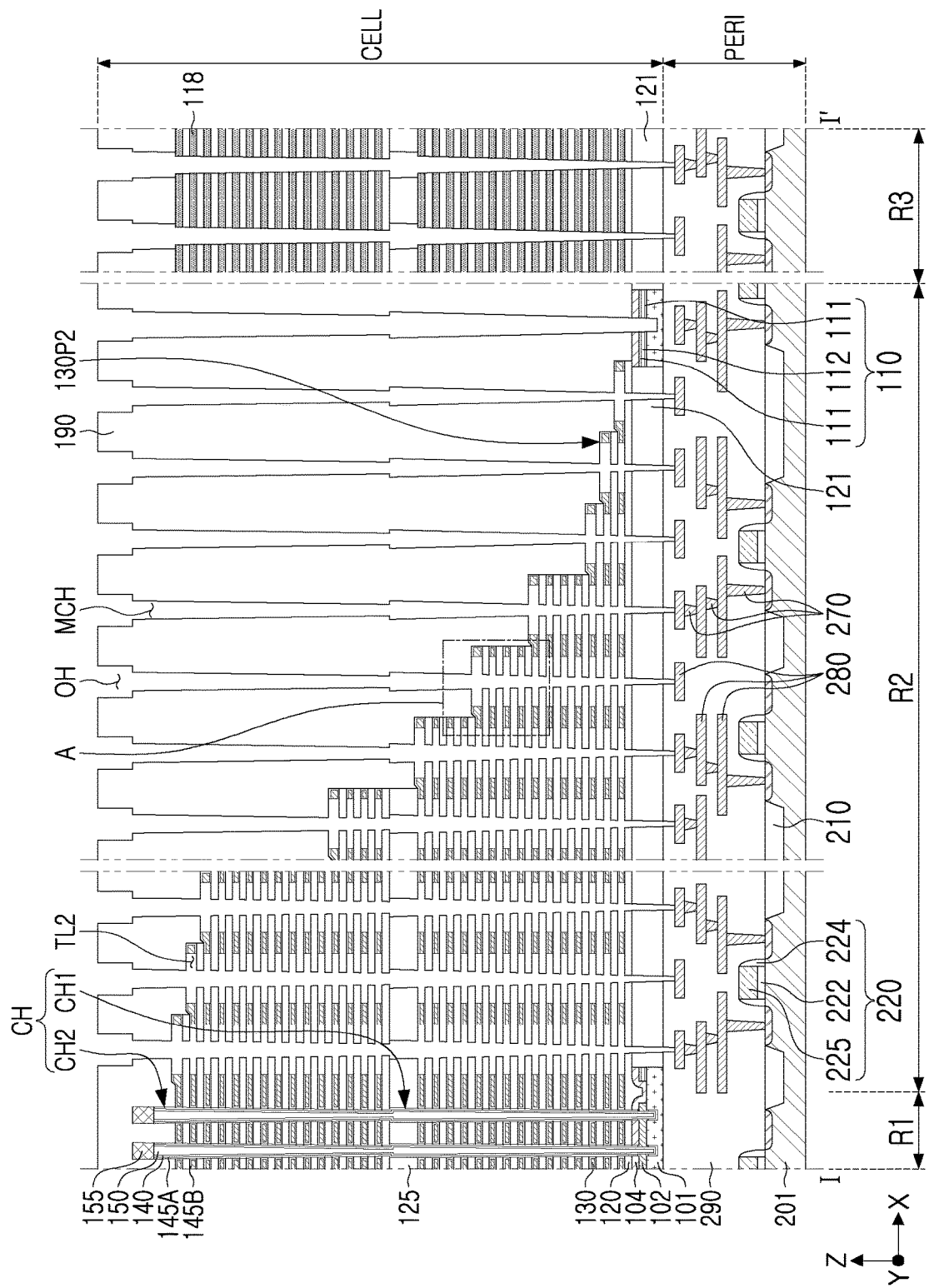
Figure 11J:
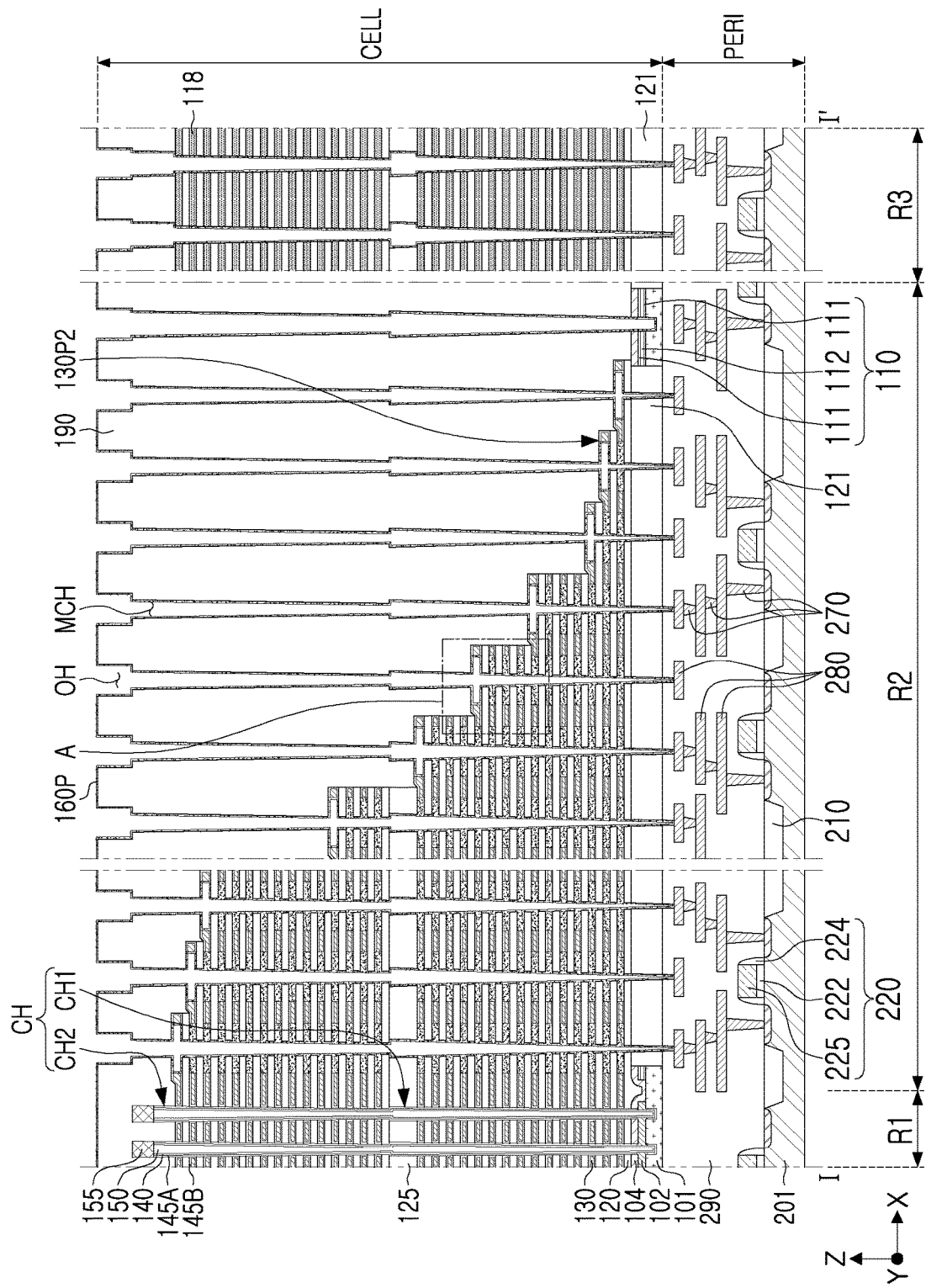
Figure 11K:
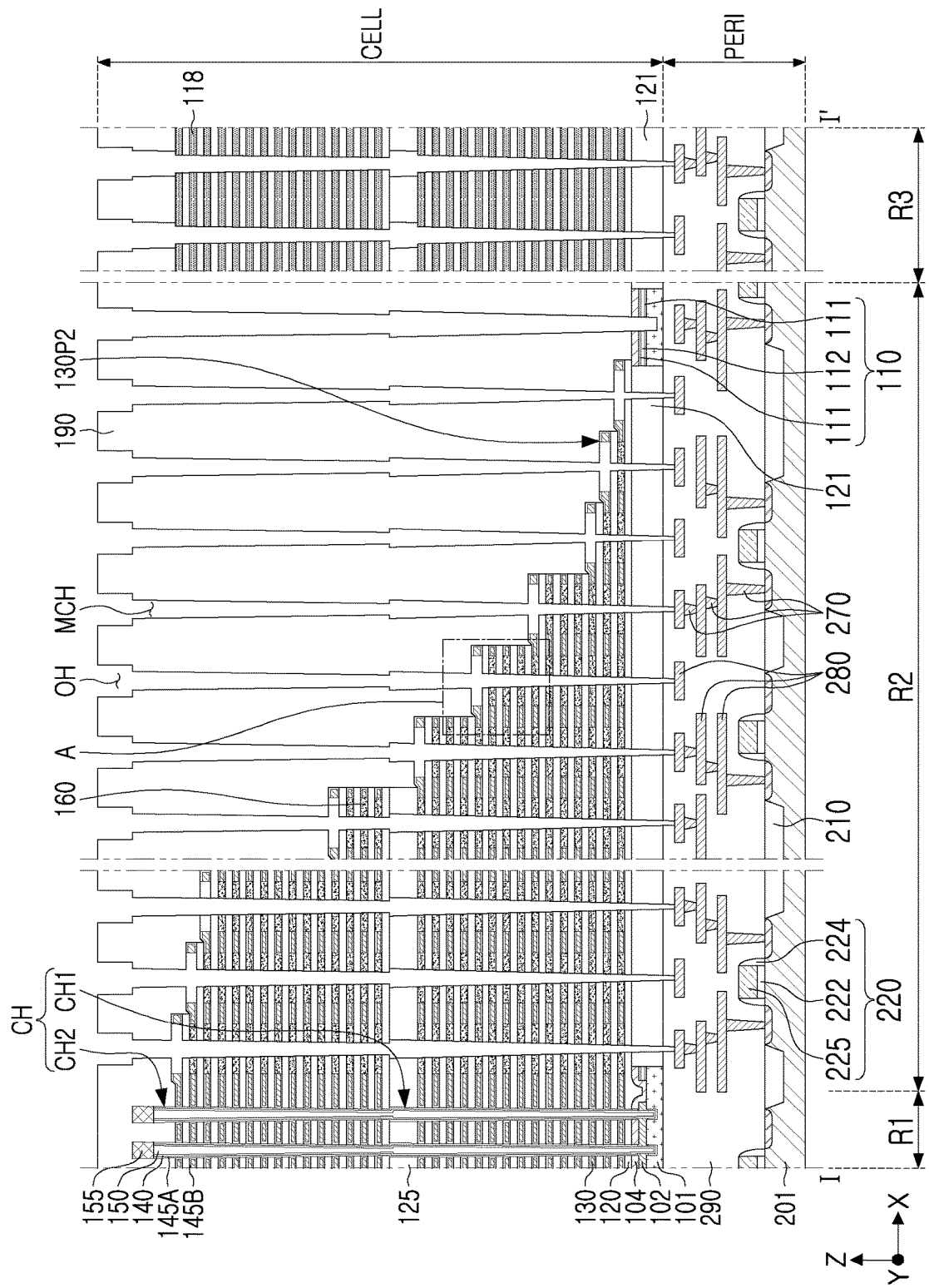
Figure 11L:
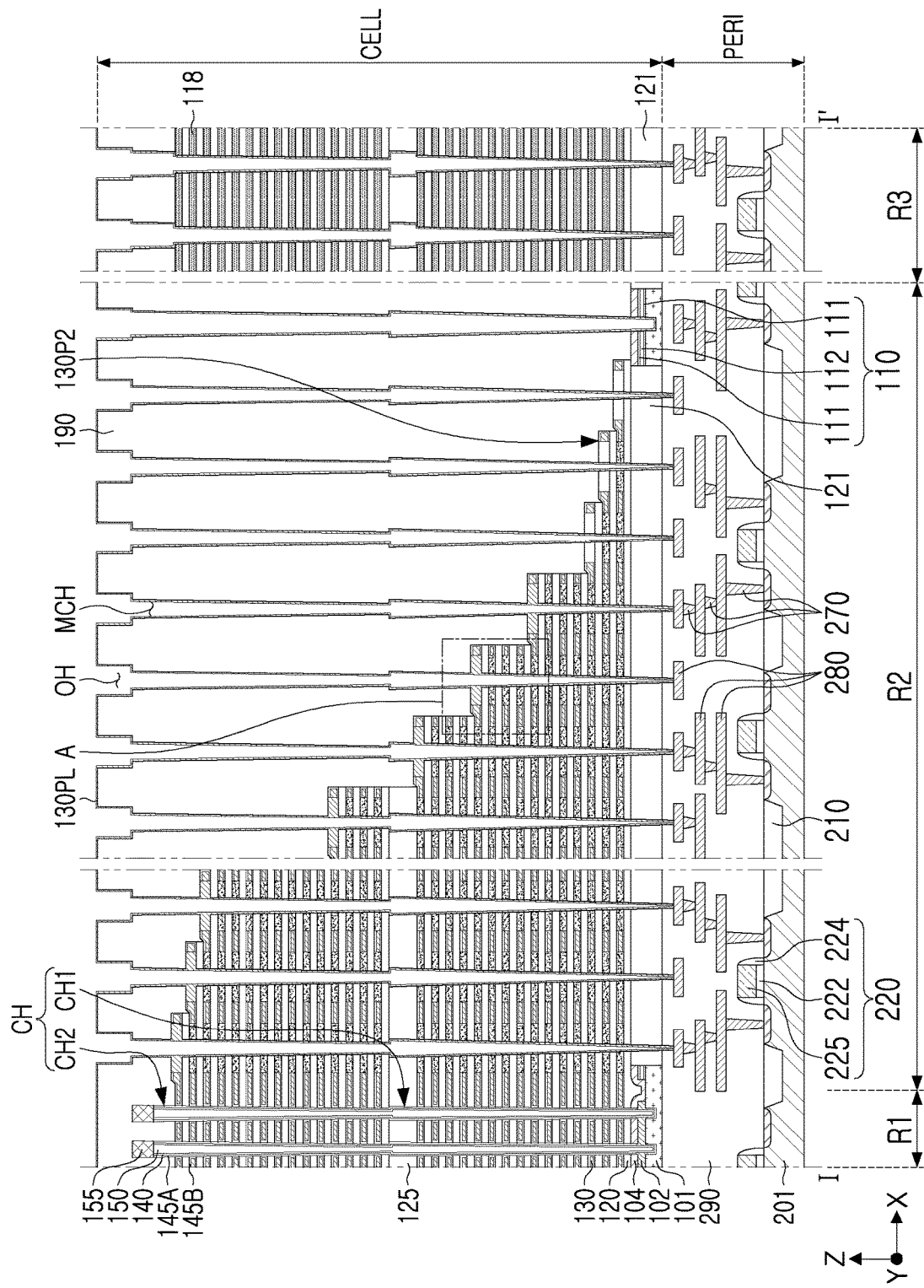
Figure 11M:
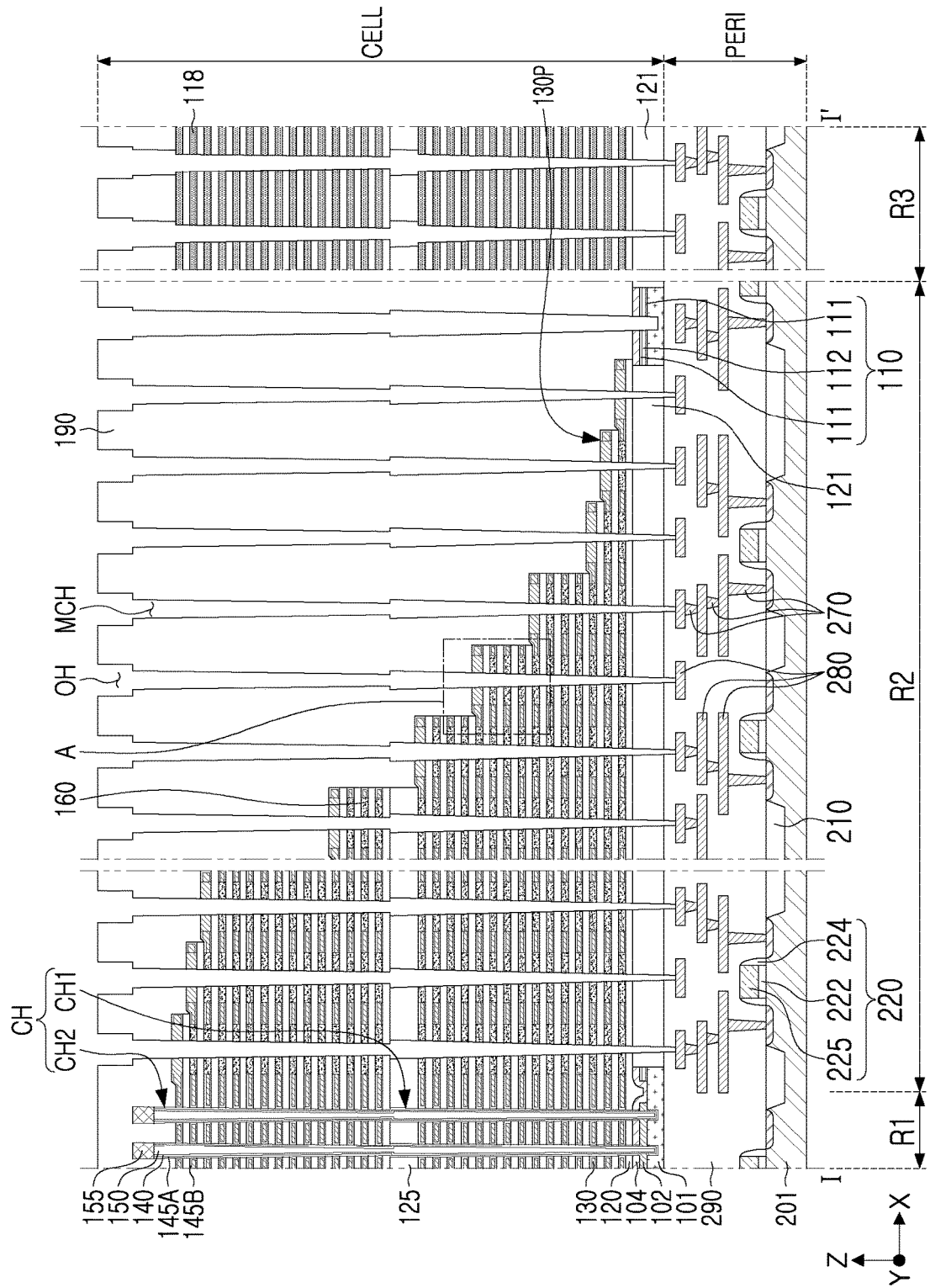
Figure 11N:
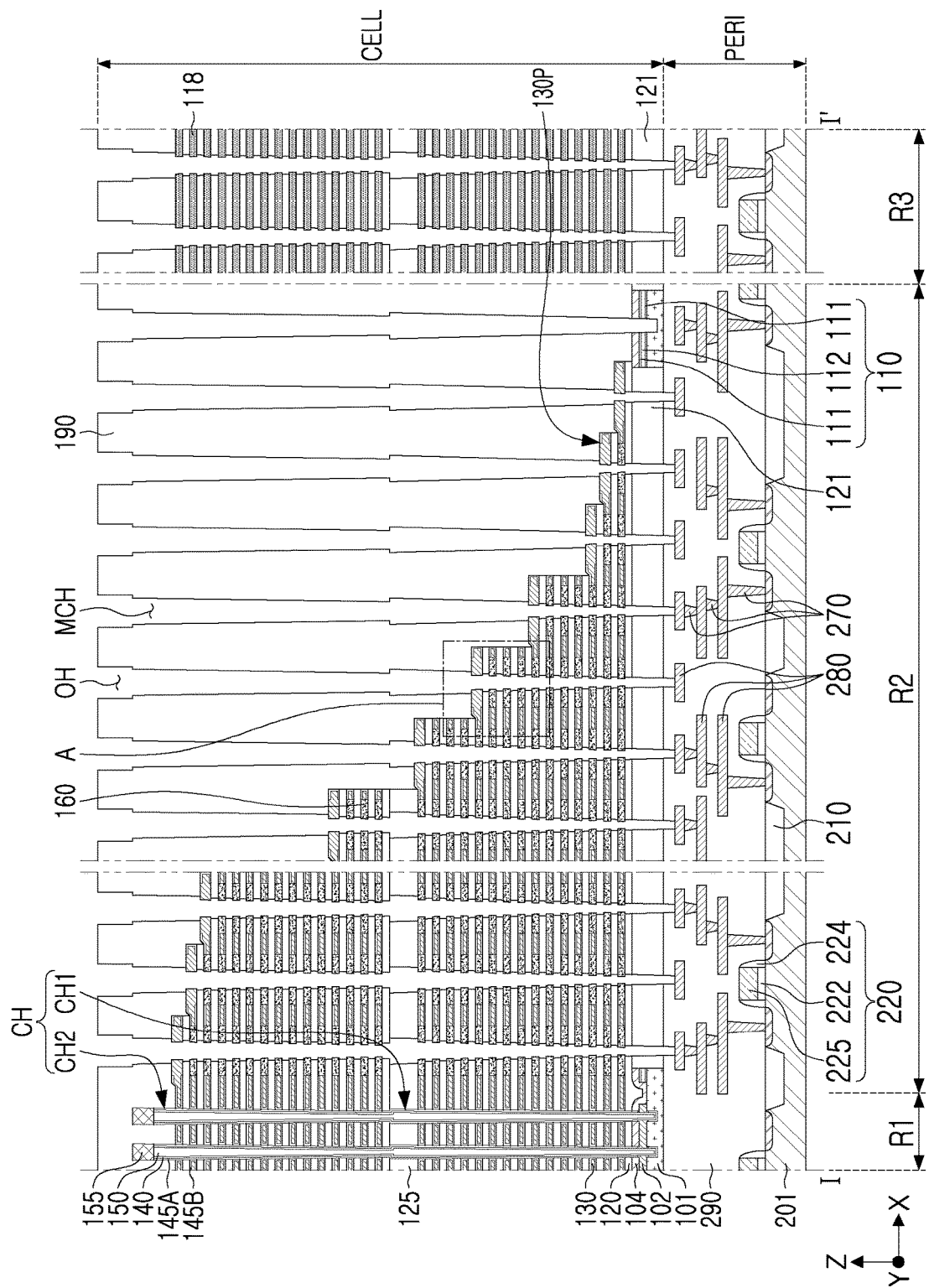
Figure 11O:
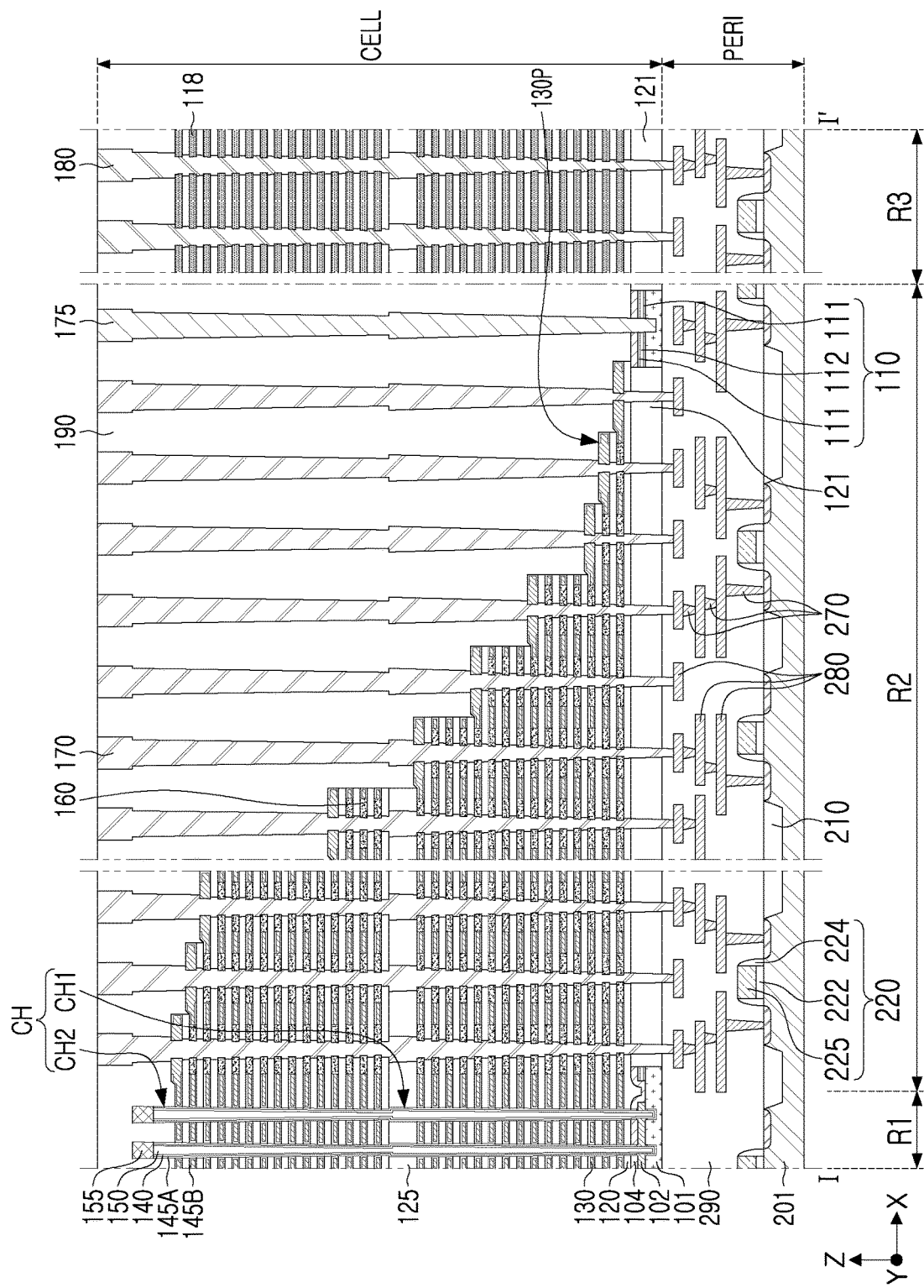

FIGS. 11A to 11O are cross-sectional views illustrating a method of manufacturing a semiconductor device according to example embodiments, cross-sectional views corresponding to FIG. 2A.

FIGS. 12A to 12F are enlarged views illustrating a method of manufacturing a semiconductor device, illustrating a portion of a semiconductor device, according to example embodiments. FIGS. 12A to 12F illustrate region "A" in FIGS. 11I to 11N.

Referring to FIG. 11A, a peripheral circuit region PERI including circuit devices 220 and circuit interconnection structures may be formed on the first substrate 201, and a second substrate 101 on which the memory cell region CELL is provided, a horizontal insulating layer 110, a second horizontal conductive layer 104, and a substrate insulating layer 121 may be formed on the peripheral circuit region PERI.

First, device isolation layers 210 may be formed in the first substrate 201, and the circuit gate dielectric layer 222 and the circuit gate electrode 225 may be formed in order on the first substrate 201. The device isolation layers 210 may be formed by, for example, a shallow trench separation (STI) process. The circuit gate dielectric layer 222 and the circuit gate electrode 225 may be formed using an atomic layer deposition (ALD) process or a chemical vapor deposition (CVD) process. The circuit gate dielectric layer 222 may be formed of silicon oxide, and the circuit gate electrode 225 may be formed of at least one of polycrystalline silicon or a metal silicide layer, but example embodiments thereof are not limited thereto. Thereafter, a spacer layer 224 and source/drain regions 205 may be formed on both sidewalls of the circuit gate dielectric layer 222 and the circuit gate electrode 225. In example embodiments, the spacer layer 224 may be formed of a plurality of layers. Thereafter, the source/drain regions 205 may be formed by performing an ion implantation process.

The circuit contact plugs 270 of the circuit interconnection structures may be formed by partially forming the insulating layer 290 in the peripheral region, removing a portion thereof by etching, and filling the conductive material. The circuit interconnection lines 280 may be formed by, for example, depositing a conductive material and patterning the conductive material.

The peripheral region insulating layer 290 may include a plurality of insulating layers. A portion of the peripheral region insulating layer 290 may be formed in each of processes of forming the circuit interconnection structures and, by forming a portion thereof above the uppermost circuit interconnection line 280, such that the peripheral region insulating layer 290 may be formed to cover the circuit devices 220 and the circuit interconnection structures.

Thereafter, the second substrate 101 may be formed on the peripheral region insulating layer 290. The second substrate 101 may be formed of, for example, polycrystalline silicon, and may be formed by a CVD process. Polycrystalline silicon included in the second substrate 101 may include impurities.

The first and second horizontal insulating layers 111 and 112 included in the horizontal insulating layer 110 may be alternately stacked on the second substrate 101. The horizontal insulating layer 110 may be partially replaced with the first horizontal conductive layer 102 in FIG. 2A through a subsequent process. The first horizontal insulating layers 111 may include a material different from that of the second horizontal insulating layer 112. For example, the first horizontal insulating layers 111 may be formed of the same material as that of the interlayer insulating layers 120, and the second horizontal insulating layer 112 may be formed of the same material as that of the sacrificial insulating layers 118 formed in a subsequent process. The horizontal insulating layer 110 may be partially removed by a patterning process in some regions, that is, for example, in the second region R2 of the second substrate 101.

The second horizontal conductive layer 104 may be formed on the horizontal insulating layer 110, and may be in contact with the second substrate 101 in a region from which the horizontal insulating layer 110 is removed. Accordingly, the second horizontal conductive layer 104 may be bent along end portions of the horizontal insulating layer 110, may cover the ends, and may extend to the second substrate 101.

The substrate insulating layer 121 may be formed to penetrate the second substrate 101 in regions in which the contact plugs 170 (see FIG. 2A) are disposed among the third region R3 and the second region R2 of the memory cell structure CELL. The substrate insulating layer 121 may be formed by removing a portion of the second substrate 101, the horizontal insulating layer 110, and the second horizontal conductive layer 104, and filling the insulating material therein. After filling the insulating material, a planarization process may be further performed using a chemical mechanical polishing (CMP) process. Accordingly, the upper surface of the substrate insulating layer 121 may be substantially coplanar with the upper surface of the second horizontal conductive layer 104.

Referring to FIG. 11B, the sacrificial insulating layers 118 and the interlayer insulating layers 120 included in the lower stack structure may be alternately stacked on the second horizontal conductive layer 104, a step structure may be formed, and the sacrificial pad regions 118P may be formed.

In this process, sacrificial insulating layers 118 and interlayer insulating layers 120 may be formed in a region in which the first channel structures CH1 (see FIG. 2A) is disposed. An upper interlayer insulating layer 125 having a relatively great thickness may be formed in the uppermost portion. The sacrificial insulating layers 118 may be replaced with the gate electrodes 130 (see FIG. 2A) through a subsequent process.

The sacrificial insulating layers 118 may be formed of a material different from that of the interlayer insulating layers 120. For example, the interlayer insulating layer 120 and the upper interlayer insulating layer 125 may be formed of at least one of silicon oxide and silicon nitride, and the sacrificial insulating layers 118 may be formed of a material different from a material of the interlayer insulating layer 120, selected from among silicon, silicon oxide, silicon carbide, and/or silicon nitride. In example embodiments, the thicknesses of the interlayer insulating layers 120 may not be the same. Also, the thickness of the interlayer insulating layers 120 and the sacrificial insulating layers 118 and the number of the interlayer insulating layers 120 and the sacrificial insulating layers 118 may be varied from the illustrated examples.

Thereafter, a photolithography process and an etching process may be repeatedly performed on the sacrificial insulating layers 118 using a mask layer such that the upper sacrificial insulating layers 118 may extend shorter than the lower sacrificial insulating layers 118 in the second region R2. Accordingly, the sacrificial insulating layers 118 may form a step structure in a staircase shape by a predetermined unit.

Thereafter, by further forming sacrificial insulating layers 118 on the step structure, sacrificial pad regions 118P disposed in the uppermost portion may be formed in each region. The sacrificial pad regions 118P may be formed by, for example, forming a nitride layer covering the exposed upper and side surfaces of the sacrificial insulating layers 118 along the staircase shape of the lower stack structure, and remaining the nitride layer only on the upper surfaces of the sacrificial insulating layers 118 by partially removing the nitride layer. The thickness of the nitride layer may be in the range of about 20% to about 110% of the thickness of the sacrificial insulating layers 118, but example embodiments thereof are not limited thereto. The process of partially removing the nitride layer may be performed after changing properties of horizontally deposited regions of the nitride layer using, for example, plasma. Accordingly, the sacrificial insulating layers 118 may have a relatively large thickness in the sacrificial pad regions 118P.

Referring to FIG. 11C, first vertical sacrificial layers 116a penetrating the lower stack structure may be formed.

Firstly, a portion of the cell region insulating layer 190 covering or overlapping the lower stack structure of the sacrificial insulating layers 118 and the interlayer insulating layers 120 may be formed.

Thereafter, the first vertical sacrificial layers 116a may be formed in a region of the first region R1 corresponding to the first channel structures CH1 (see FIG. 2A), and may be formed in a region of the second region R2 in which the contact plugs 170, the substrate contact 175, and the through-vias 180 are disposed. The first vertical sacrificial layers 116a may be formed to have different sizes depending on the regions in which the first vertical sacrificial layers 116a are formed.

The first vertical sacrificial layers 116a may be formed by forming lower holes to penetrate the lower stack structure, and depositing a material forming the first vertical sacrificial layers 116a in the lower holes. The first vertical sacrificial layers 116a may include, for example, polycrystalline silicon.

Referring to FIG. 11D, an upper stack structure may be formed, and second vertical sacrificial layers 116b penetrating the upper stack structure may be formed.

A step structure may be formed by alternately stacking the sacrificial insulating layers 118 and the interlayer insulating layers 120 included in the upper stack structure on the lower stack structure, and the sacrificial pad regions 118P may be formed. In this process, in the upper region in which the second channel structures CH2 (see FIG. 2A) is disposed, the same process for the lower stack structure described above with reference to FIG. 11B may be performed.

Thereafter, a portion of the cell region insulating layer 190 covering the upper stack structure of the sacrificial insulating layers 118 and the interlayer insulating layers 120 may be further formed, and second vertical sacrificial layers 116b may be formed. The second vertical sacrificial layers 116b may be formed by forming upper holes penetrating the upper stack structure and exposing upper ends of the first vertical sacrificial layers 116a, and depositing a material included in the second vertical sacrificial layers 116b in the upper holes. The second vertical sacrificial layers 116b may include, for example, polycrystalline silicon.

Referring to FIG. 11E, in the first region R1, the first and second vertical sacrificial layers 116a and 116b may be removed and channel structures CH may be formed.

Firstly, an upper separation region SS (see FIG. 2B) may be formed by partially removing a portion of the sacrificial insulating layers 118 and the interlayer insulating layers 120. To form the upper separation region SS, a region in which the upper separation region SS is formed may be exposed using a mask layer, a predetermined number of the sacrificial insulating layers 118 and the interlayer insulating layers 118 may be removed from an uppermost portion, an insulating material may be deposited, thereby forming the upper separation insulating layer 103 (see FIG. 2B).

Thereafter, a mask layer ML exposing the first region R1 may be formed on the upper stack structure, and channel structures CH may be formed in the first region R1. The channel structures CH may be formed by forming channel holes by removing the first and second vertical sacrificial layers 116a and 116b and filling the channel holes. Specifically, the channel structures CH may be formed by forming the first gate dielectric layer 145A, the channel layer 140, the channel filling insulating layer 150, and the channel pads 155 in order in the channel holes. The channel layer 140 may be formed on the first gate dielectric layer 145A in the channel structures CH. The channel filling insulating layer 150 may be formed to fill the channel structures CH, and may be an insulating material. However, in example embodiments, the space between the channel layers 140 may be filled with a conductive material instead of the channel filling insulating layer 150. The channel pads 155 may be formed of a conductive material, such as, for example, polycrystalline silicon.

Referring to FIG. 11F, the first horizontal conductive layer 102 may be formed by partially removing the horizontal insulating layer 110, and the first tunnel portions TL1 may be formed by removing the sacrificial insulating layers 118.

Firstly, the cell region insulating layer 190 may be further formed, and openings penetrating the sacrificial insulating layers 118 and the interlayer insulating layers 120 and extending to the second substrate 101 may be formed in a position corresponding to the separation regions MS (see FIG. 1).

Thereafter, an etch-back process may be performed while forming separate sacrificial spacer layers in the openings, such that the second horizontal insulating layer 112 may be exposed in the first region R1. The second horizontal insulating layer 112 may be selectively removed from the exposed region, and the upper and lower first horizontal insulating layers 111 may be removed. The first and second horizontal insulating layers 111 and 112 may be removed by, for example, a wet etching process. In the process of removing the first and second horizontal insulating layers 111 and 112, a portion of the first gate dielectric layer 145A exposed in the region from which the second horizontal insulating layer 112 is removed may also be removed. The first horizontal conductive layer 102 may be formed by depositing a conductive material in the region from which the first and second horizontal insulating layers 111 and 112 are removed, and the sacrificial spacer layers may be removed from the openings. Through this process, the first horizontal conductive layer 102 may be formed in the first region R1.

Thereafter, the sacrificial insulating layers 118 including the sacrificial pad regions 118P may be selectively removed with respect to the interlayer insulating layers 120, the second horizontal conductive layer 104, and the substrate insulating layer 121 using wet etching, for example.

Referring to FIG. 11G, second gate dielectric layers 145B and gate electrodes 130 may be formed in the first tunnel portions TL1.

Second gate dielectric layers 145B and gate electrodes 130 may be formed in the first tunnel portions TL1 from which the sacrificial insulating layers 118 are removed. The second gate dielectric layers 145B may be deposited before the gate electrodes 130 and may cover external surfaces of the gate electrodes 130, such as, for example, upper surfaces, lower surfaces, and side surfaces. The pad regions 130P of the gate electrodes 130 may be formed in the sacrificial pad regions 118P.

The gate electrodes 130 may include a conductive material, such as, for example, a metal, polycrystalline silicon, or a metal silicide material. After the gate electrodes 130 are formed, a separation insulating layer 105 (see FIG. 2B) may be formed in the openings formed in the separation regions MS.

Referring to FIG. 11H, contact holes MCH may be formed by forming upper openings OP in the second region R2, and by removing the first and second vertical sacrificial layers 116a and 116b.

When the cell region insulating layer 190 and/or other layers are formed on the second vertical sacrificial layers 116b in the second region R2 during the process, the upper openings OP may be formed to expose the upper ones of the second vertical sacrificial layers 116b by removing the cell region insulating layer 190 and/or other layers. Accordingly, the specific shape and depth of the upper openings OP may be varied in example embodiments.

The contact holes MCH may be formed by removing the first and second vertical sacrificial layers 116a and 116b exposed through the upper openings OP.

Figure 12A:
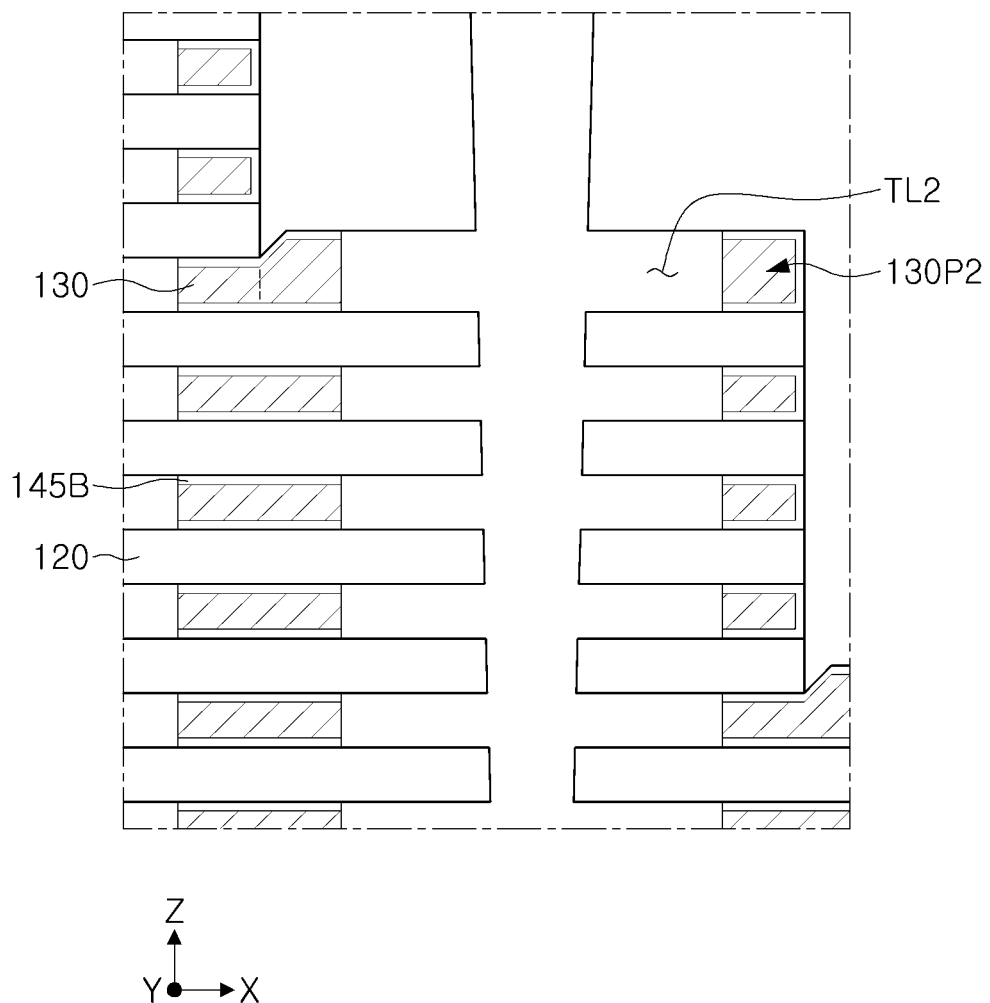
FIGS. 12A to 12F are enlarged views illustrating a method of manufacturing a semiconductor device, illustrating a portion of a semiconductor device, according to example embodiments of the present disclosure.

Referring to FIGS. 11I and 12A, the second tunnel portions TL2 may be formed by laterally removing a portion of the gate electrodes 130 exposed through the contact holes MCH.

The second tunnel portions TL2 may be formed by removing the gate electrodes 130 and the second gate dielectric layers 145B exposed through the contact holes MCH around the contact holes MCH by a predetermined length in the X-direction by applying an etchant through the contact holes MCH. The gate electrodes 130 and the second gate dielectric layers 145B may be removed by, for example, a wet etching process. The gate electrodes 130 and the second gate dielectric layers 145B may be removed together in a single process or may be removed in order in a plurality of consecutive processes. The second tunnel portions TL2 may be formed to have substantially the same length on side surfaces around the contact holes MCH. In a region from which a portion of the pad regions 130P is removed in the uppermost region, the second tunnel portions TL2 may be formed to have a relatively large height.

Figure 12B:
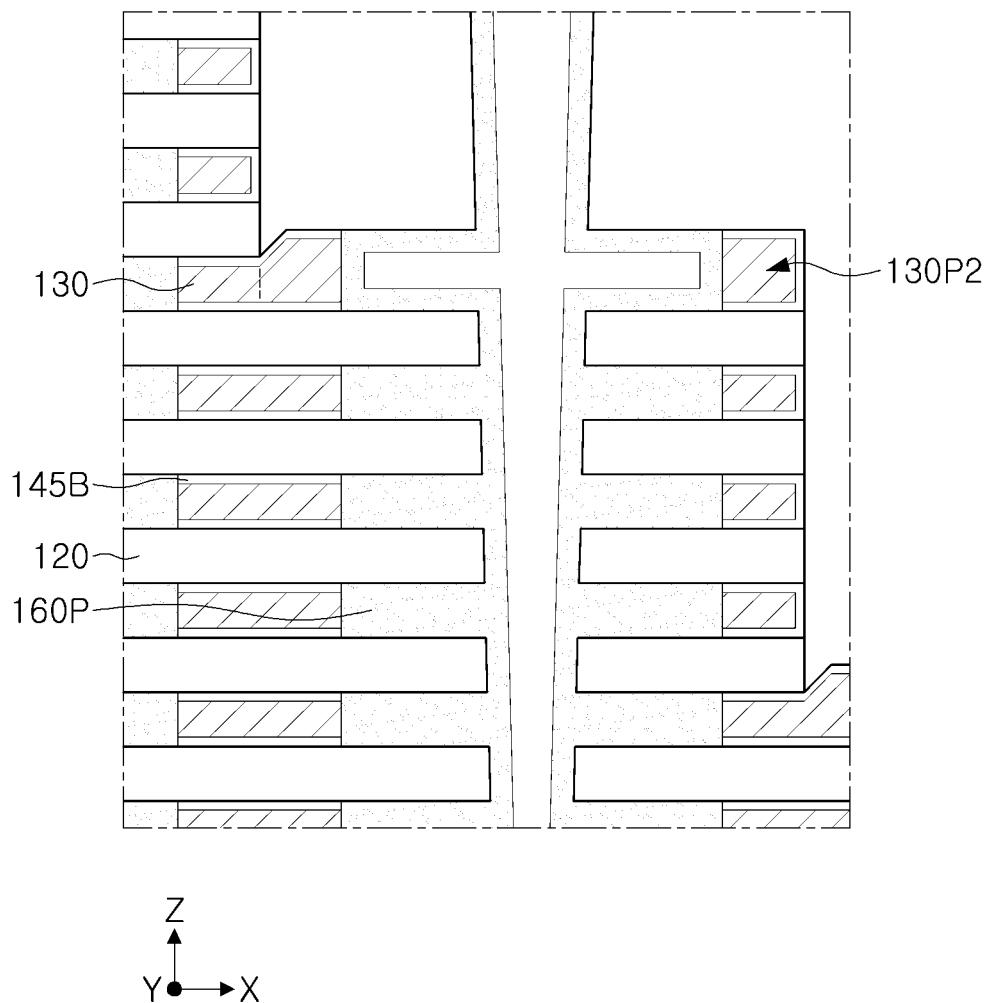

Referring to FIGS. 11J and 12B, a preliminary contact insulating layer 160P forming the contact insulating layers 160 (see FIG. 2A) may be formed in the second tunnel portions TL2.

The preliminary contact insulating layer 160P may be formed such that the preliminary contact insulating layer 160P may not fill the uppermost second tunnel portions TL2, which may be the pad regions 130P, and may entirely fill the second tunnel portions TL2 below the uppermost second tunnel portions TL2. The thickness of the preliminary contact insulating layer 160P may be selected to be equal to or greater than a half the height of the second tunnel portions TL2 disposed below the uppermost second tunnel portions TL2, and to be less than a half the height of the uppermost second tunnel portions TL2. For example, the thickness of the preliminary contact insulating layer 160P may be about 25 nm or less, such as, for example, about 15 nm or less.

Figure 12C:
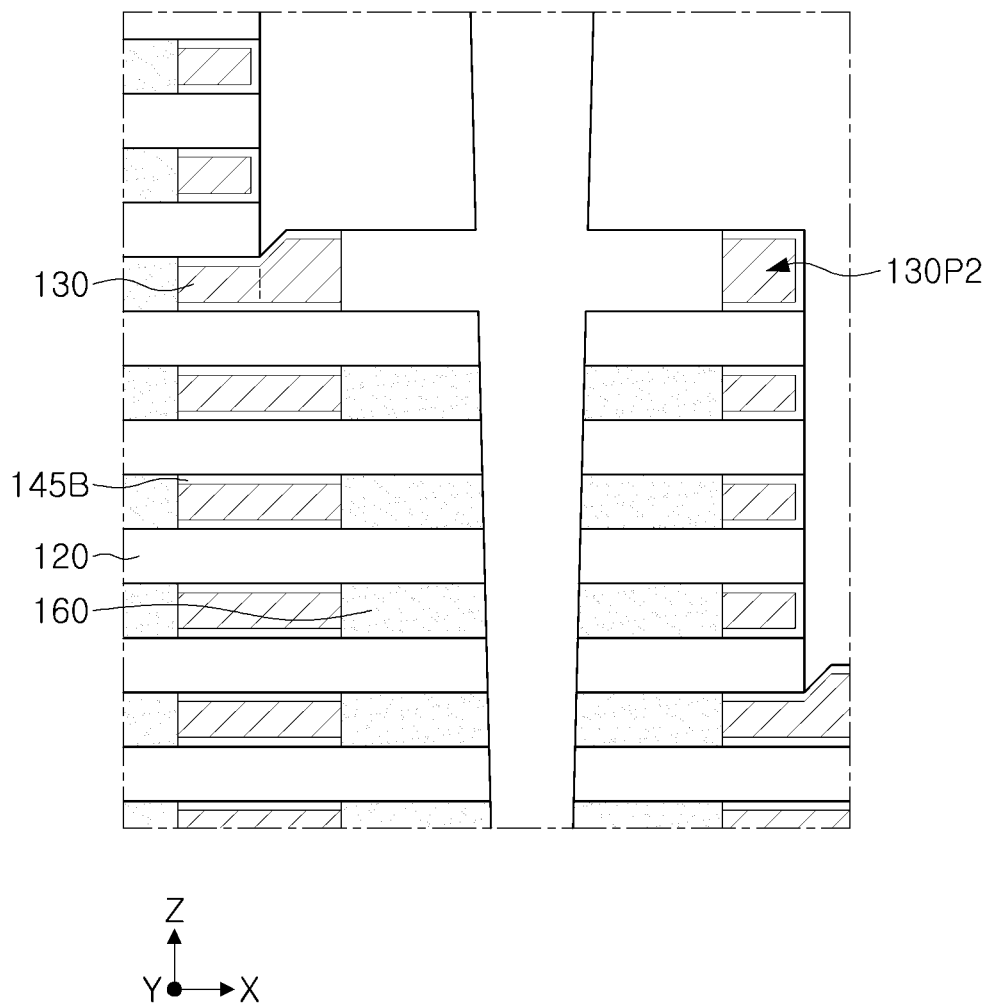

Referring to FIGS. 11K and 12C, the contact insulating layers 160 may be formed by partially removing the preliminary contact insulating layer 160P.

For example, the preliminary contact insulating layer 160P may be removed by a predetermined thickness using a wet etching process. Accordingly, the preliminary contact insulating layer 160P may be removed from the uppermost second tunnel portions TL2 and internal side walls of the contact holes MCH, and the contact insulating layers 160 filling the second tunnel portions TL2 below the uppermost second tunnel portions TL2 may be formed.

Figure 12D:
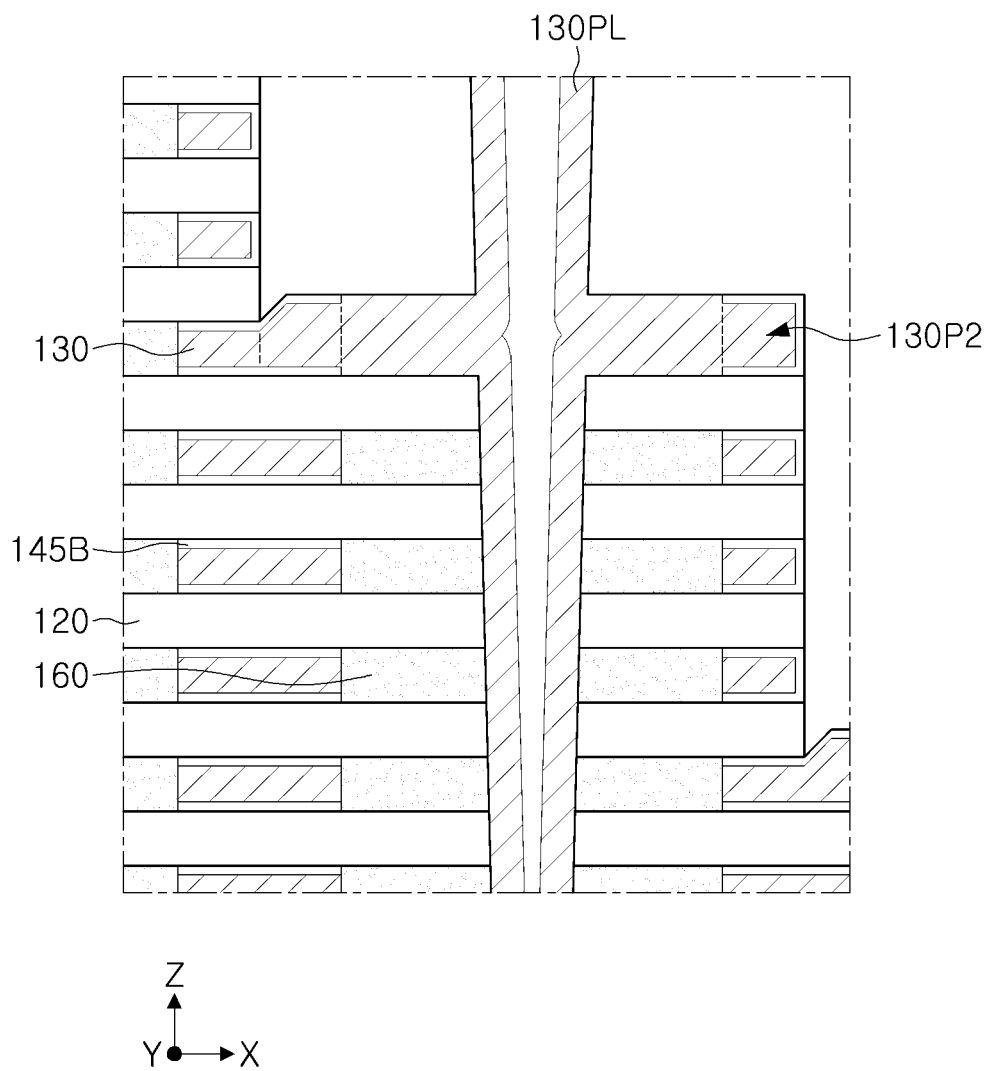

Referring to FIGS. 11L and 12D, the pad conductive layer 130PL forming the first pad portions 130P1 (see FIG. 3A) of the pad regions 130P may be formed.

The pad conductive layer 130PL may be formed to fill the uppermost second tunnel portions TL2 and to cover or overlap the internal side walls of the contact holes MCH. The pad conductive layer 130PL may be formed by, for example, an ALD process.

Figure 12E:
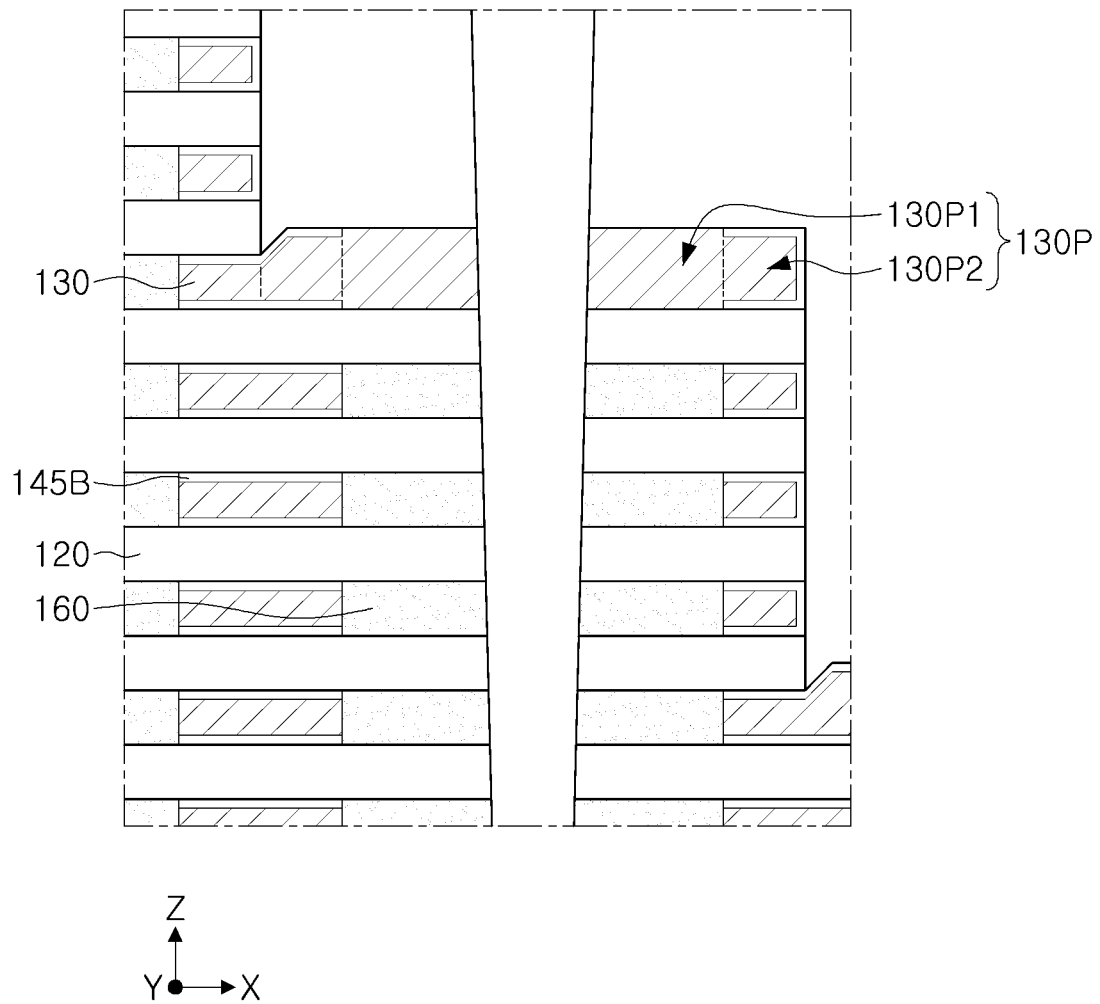

Referring to FIGS. 11M and 12E, the first pad portions 130P1 of the pad regions 130P may be formed by partially removing the pad conductive layer 130PL.

For example, the pad conductive layer 130PL may be removed by a predetermined thickness using a wet etching process. Accordingly, the pad conductive layer 130PL may fill the uppermost second tunnel portions TL2 such that the first pad portions 130P1 of the pad regions 130P may be formed, and the pad conductive layer 130PL may be removed from the internal side walls of the contact holes MCH. As such, since the first pad portions 130P1 are formed by a process different from the processes of forming the other regions, an interfacial surface with the second pad portions 130P2 may be distinct. Also, in some example embodiments, the first pad portions 130P1 may include a material different from that of the second pad portions 130P2 and the lower gate electrodes 130.

Figure 12F:
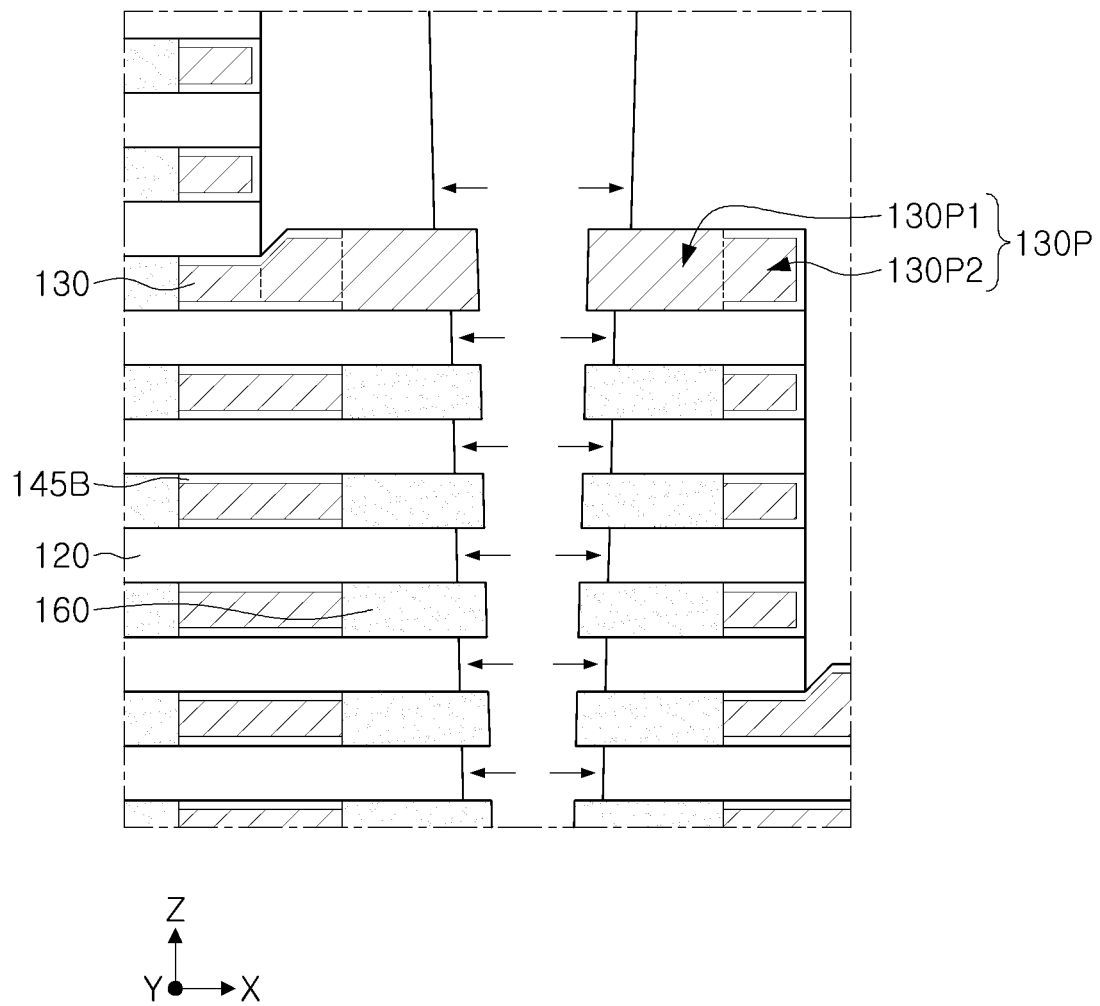

Referring to FIGS. 11N and 12F, the interlayer insulating layers 120 and the cell region insulating layer 190 may be partially removed around the contact holes MCH.

The interlayer insulating layers 120 and the cell region insulating layer 190 exposed through the contact holes MCH around the contact holes MCH may be removed by a predetermined length in the X-direction by applying an etchant through the contact holes MCH. The interlayer insulating layers 120 and the cell region insulating layer 190 may be selectively removed by, for example, a wet etching process. Accordingly, the interlayer insulating layers 120 may be recessed below the pad regions 130P such that the gate electrodes 130 and the contact insulating layers 160 may protrude further than the interlayer insulating layers 120.

The inflow of the etchant may be relatively large on the pad regions 130P, such that a relatively large amount of the cell region insulating layer 190 may be removed, and a relatively small amount of the interlayer insulating layers 120 may be removed. However, in example embodiments, the cell region insulating layer 190 and the interlayer insulating layers 120 may be removed by similar lengths.

In this process, the substrate insulating layer 121 may also be recessed below the contact holes MCH. In a region corresponding to the substrate contact 175, the second horizontal insulating layer 112 may also be partially recessed around the contact holes MCH. Also, in the third region R3, the interlayer insulating layers 120, the cell region insulating layer 190, and the substrate insulating layer 121 may be partially recessed around the contact holes MCH such that the sacrificial insulating layers 118 may relatively protrude.

Referring to FIG. 11O, contact plugs 170, a substrate contact 175, and through-vias 180 may be formed by depositing conductive material in the contact holes MCH.

The contact plugs 170, the substrate contact 175, and the through-vias 180 may be formed together, such that the contact plugs 170, the substrate contact 175, and the through-vias 180 may include the same material and may have the same internal structure. In example embodiments, the first and second vertical sacrificial layers 116a and 116b may be preferentially formed, and the processes in FIGS. 11H to 11O may be performed to form the contact plugs 170, such that the contact plugs 170 may be self-aligned on the gate electrodes 130.

In example embodiments, the pad region 130P and the contact plug 170 may be formed of the same material. However, even in this case, since the pad region 130P and the contact plug 170 are formed through different processes, a boundary may be distinct due to discontinuity of the crystal structure on the interfacial surface, presence of oxide on the interfacial surface, or the like.

Thereafter, referring back to FIG. 2A, upper interconnection structures such as upper interconnections 185 may be further formed on the contact plugs 170, the substrate contact 175, and the through-vias 180, such that the semiconductor device 100 may be manufactured.

Figure 13:
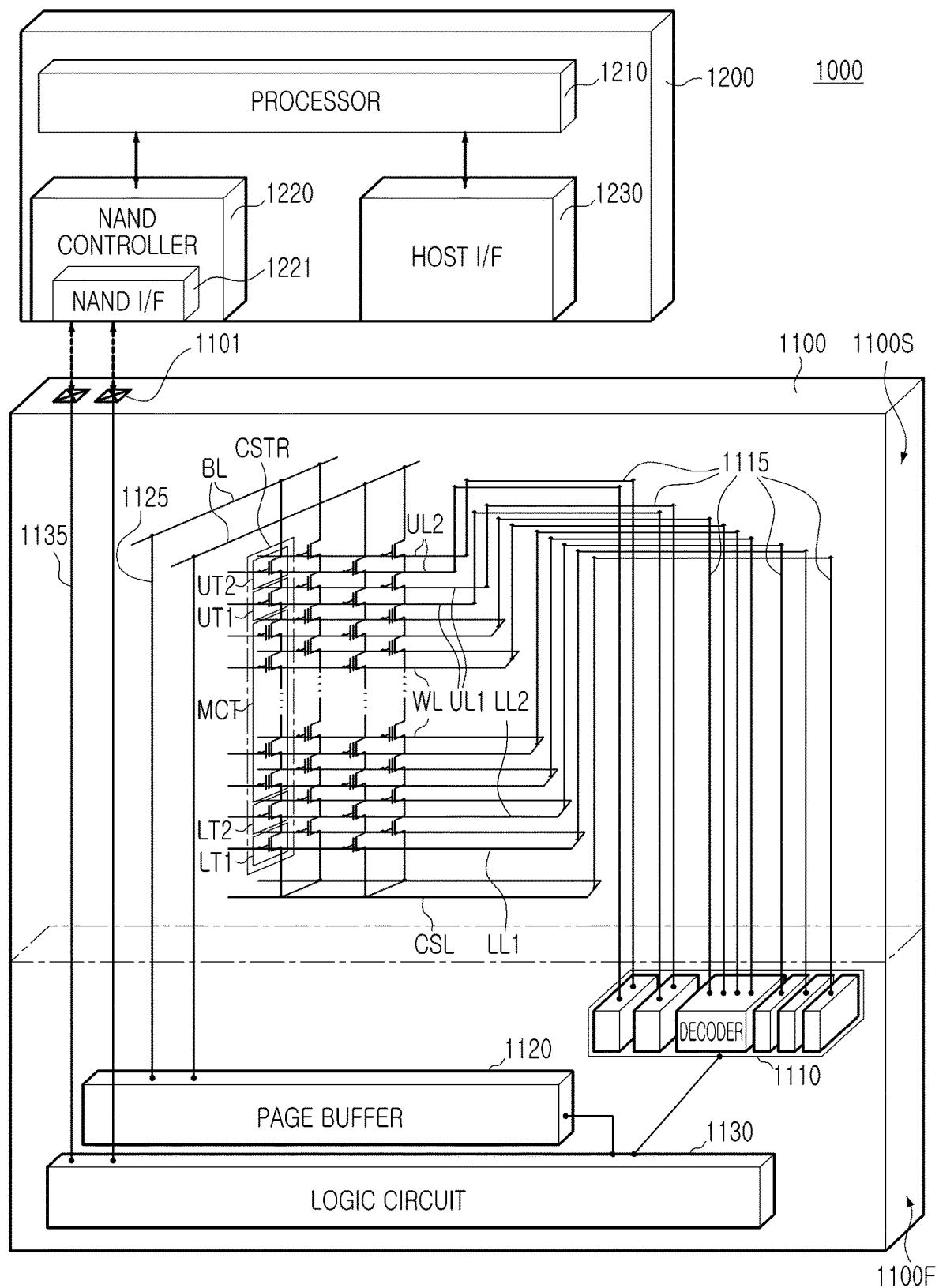
FIG. 13 is a view illustrating a data storage system including a semiconductor device according to example embodiments of the present disclosure.

FIG. 13 is a view illustrating a data storage system including a semiconductor device according to example embodiments.

Referring to FIG. 13, a data storage system 1000 may include a semiconductor device 1100 and a controller 1200 electrically connected to the semiconductor device 1100. The data storage system 1000 may be implemented as a storage device including one or a plurality of semiconductor devices 1100 or an electronic device including a storage device. For example, the data storage system 1000 may be implemented as a solid state drive (SSD) device, a universal serial bus (USB), a computing system, a medical device, or a communication device, including one or a plurality of semiconductor devices 1100.

The semiconductor device 1100 may be implemented as a nonvolatile memory device, and may be implemented as the NAND flash memory device described with reference to FIGS. 1 to 10, for example. The semiconductor device 1100 may include a first semiconductor structure 1100F and a second semiconductor structure 1100S on the first semiconductor structure 1100F. In example embodiments, the first semiconductor structure 1100F may be disposed on the side of the second semiconductor structure 1100S. The first semiconductor structure 1100F may be configured as a peripheral circuit structure including a decoder circuit 1110, a page buffer 1120, and a logic circuit 1130. The second semiconductor structure 1100S may be configured as a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second semiconductor structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in example embodiments.

In example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection interconnections 1115 extending from the first semiconductor structure 1100F to the second semiconductor structure 1100S. The bit lines BL may be electrically connected to the page buffer 1120 through second connection interconnections 1125 extending from the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input and output pad 1101 electrically connected to the logic circuit 1130. The input and output pad 1101 may be electrically connected to the logic circuit 1130 through an input and output connection interconnection 1135 extending from the first semiconductor structure 1100F to the second semiconductor structure 1100S.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1100.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 for processing communication with the semiconductor device 1100. Control commands for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communication function between the data storage system 1000 and an external host. When a control command is received from an external host through the host interface 1230, the processor 1210 may control the semiconductor device 1100 in response to the control command.

Figure 14:
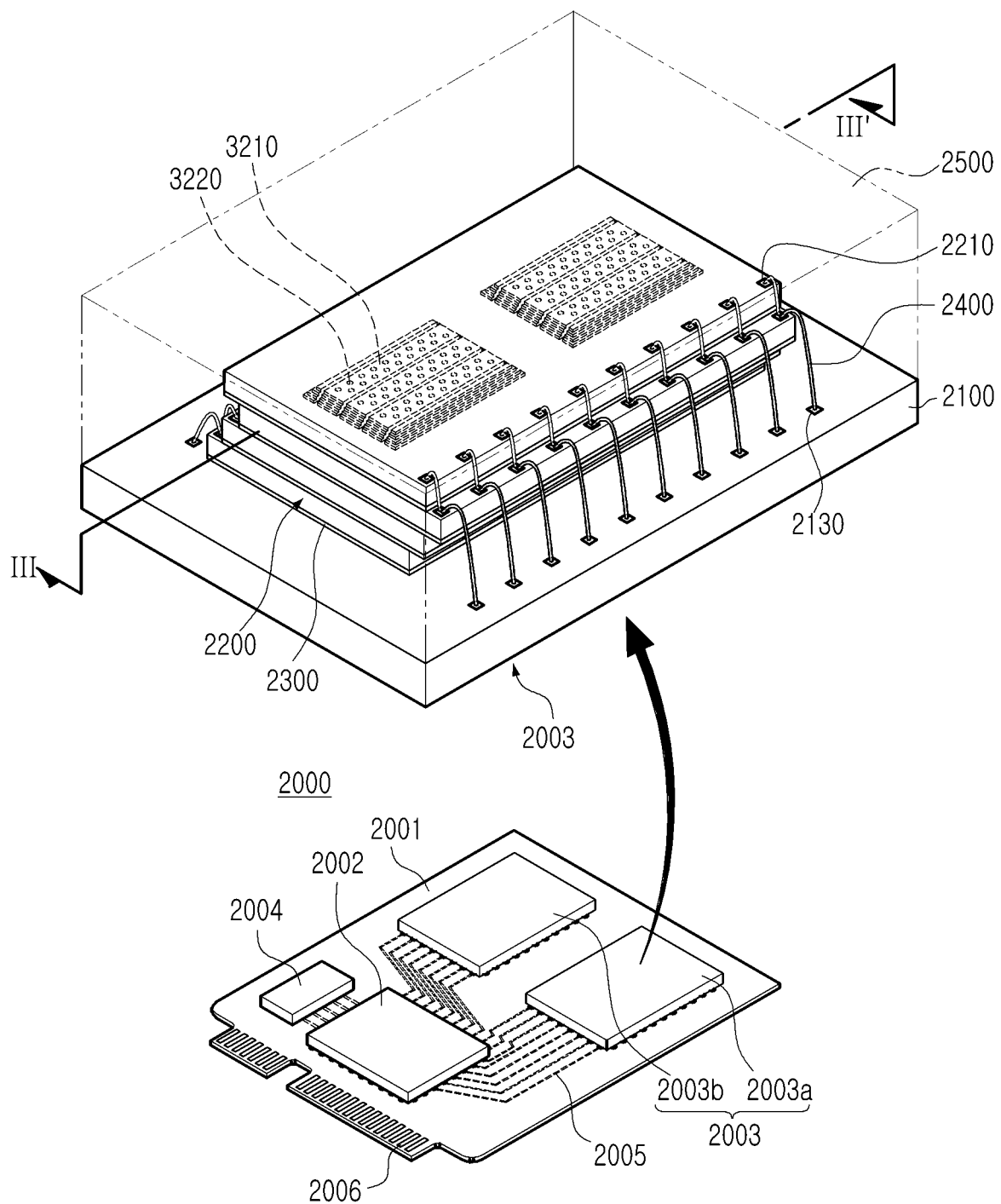
FIG. 14 is a perspective view illustrating a data storage system including a semiconductor device according to example embodiments of the present disclosure.

FIG. 14 is a perspective view illustrating a data storage system including a semiconductor device according to example embodiments.

Referring to FIG. 14, a data storage system 2000 according to example embodiments may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 formed on the main substrate 2001.

The main substrate 2001 or main board may include a connector 2006 including a plurality of pins coupled to an external host. The number and the arrangement of the plurality of pins in the connector 2006 may be varied depending on a communication interface between the data storage system 2000 and the external host. In example embodiments, the data storage system 2000 may communication with the external host through one of a universal serial bus (USB), a peripheral component interconnect express (PCI-Express), a serial advanced technology attachment (SATA), and an M-phy for universal flash storage (UFS). In example embodiments, the data storage system 2000 may operate by power supplied from the external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may improve an operation speed of the data storage system 2000.

The DRAM 2004 may be configured as a buffer memory for mitigating a difference in speeds between the semiconductor package 2003, a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 further may include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 to the package substrate 2100, and a molding layer 2500 covering or overlapping the semiconductor chips 2200 and the connection structure 2400 on the package substrate 2100.

The package substrate 2100 may be configured as a printed circuit substrate including the package upper pads 2130. Each of the semiconductor chips 2200 may include an input and output pad 2210. The input and output pad 2210 may correspond to the input and output pad 1101 in FIG. 13. Each of the semiconductor chips 2200 may include gate stack structures 3210 and channel structures 3220. Each of the semiconductor chips 2200 may include the semiconductor device described with reference to FIGS. 1 to 10.

In example embodiments, the connection structure 2400 may be a bonding wire electrically connecting the input and output pad 2210 to the package upper pads 2130. Accordingly, in each of the first and second semiconductor packages 2003a and 2003b, the semiconductor chips 2200 may be electrically connected to each other through a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure a through silicon via (TSV), instead of the connection structure 2400 of a bonding wire method.

In example embodiments, the controller 2002 and the semiconductor chips 2200 may be included in a single package. For example, the controller 2002 and the semiconductor chips 2200 may be mounted on a separate interposer substrate different from the main substrate 2001, and the controller 2002 may be connected to the semiconductor chips 2200 by interconnections formed on the interposer substrate.

Figure 15:
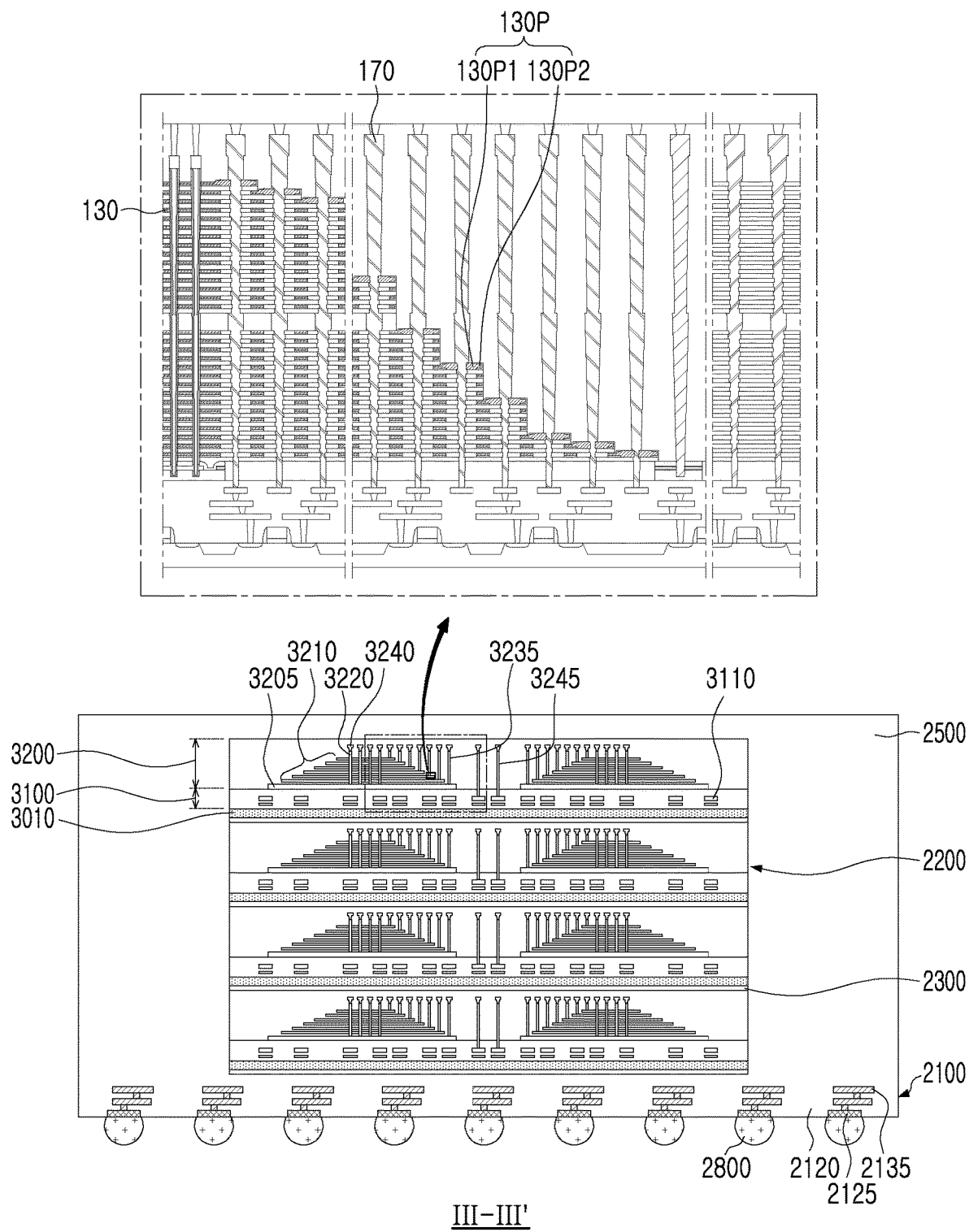
FIG. 15 is a cross-sectional view illustrating a semiconductor package according to example embodiments of the present disclosure.

FIG. 15 is a cross-sectional view illustrating a semiconductor device according to example embodiments. FIG. 15 illustrates example embodiments of the semiconductor package 2003 in FIG. 14, and illustrates the semiconductor package 2003 in FIG. 14 taken along line III-III'.

Referring to FIG. 23, in the semiconductor package 2003, the package substrate 2100 may be configured as a printed circuit board. The package substrate 2100 may include a package substrate body portion 2120, package upper pads 2130 (see FIG. 14) disposed on an upper surface of the package substrate body portion 2120, lower pads 2125 disposed on a lower surface of the package substrate body portion 2120 or exposed through the lower surface, and internal interconnections 2135 electrically connecting the package upper pads 2130 to the lower pads 2125 in the package substrate body portion 2120. The package upper pads 2130 may be electrically connected to the connection structures 2400. The lower pads 2125 may be connected to the interconnection patterns 2005 of the main substrate 2010 of the data storage system 2000 through conductive connection portions 2800 as in FIG. 14.

Each of the semiconductor chips 2200 may include a semiconductor substrate 3010 and a first semiconductor structure 3100 and a second semiconductor structure 3200 stacked in order on the semiconductor substrate 3010. The first semiconductor structure 3100 may include a peripheral circuit region including peripheral interconnections 3110. The second semiconductor structure 3200 may include a common source line 3205, a gate stack structure 3210 on the common source line 3205, channel structures 3220 and separation structures 3230 penetrating the gate stack structure 3210, bit lines 3240 electrically connected to the memory channel structures 3220, and cell contact plugs 3235 electrically connected to the word lines WL (see FIG. 13) of the gate stack structure 3210. As described with reference to FIGS. 1 to 10, in each of the semiconductor chips 2200, the contact plugs 170 may contact the upper surface, the side surface, and the lower surface of the pad regions 130P of the gate electrodes 130, and may extend through the gate stacked structure 3210 into the first semiconductor structure 3100.

Each of the semiconductor chips 2200 may include a through interconnection 3245 electrically connected to the peripheral interconnections 3110 of the first semiconductor structure 3100 and extending into the second semiconductor structure 3200. The through interconnection 3245 may be disposed on an external side of the gate stack structure 3210, and may be further disposed to penetrate the gate stack structure 3210. Each of the semiconductor chips 2200 may further include an input and output pad 2210 (see FIG. 14) electrically connected to the peripheral interconnections 3110 of the first semiconductor structure 3100.

According to the aforementioned example embodiments, by including the structure in which the pad region of the gate electrode protrudes into the contact plug, a semiconductor device having improved electrical properties and reliability, and a data storage system including the same may be provided.

While the example embodiments have been illustrated and described above, it will be apparent to those skilled in the art that modifications and variations could be made without departing from the scope of the present disclosure as defined by the appended claims.

What is claimed is:

1. A semiconductor device, comprising:
a first semiconductor structure comprising a first substrate, circuit devices on the first substrate, and circuit interconnection lines electrically connected to the circuit devices; and
a second semiconductor structure on the first semiconductor structure,
wherein the second semiconductor structure comprises:
a second substrate having a first region and a second region;
gate electrodes stacked and spaced apart from each other in a first direction perpendicular to an upper surface of the second substrate, and extend at different lengths in a second direction on the second region, and comprising pad regions having upper surfaces exposed on the second region;
interlayer insulating layers alternately stacked with the gate electrodes;
channel structures on the first region which penetrate the gate electrodes and extend in the first direction, wherein each of the channel structures comprises a channel layer;
contact plugs that are connected to the pad regions of the gate electrodes, extend in the first direction, and penetrate the pad regions; and
contact insulating layers below the pad regions and respectively surrounding the contact plugs,
wherein the pad regions of the gate electrodes have a first thickness and other regions of the gate electrodes have a second thickness less than the first thickness, and
wherein the contact plugs contact portions of upper surfaces, side surfaces, and lower surfaces of respective ones of the pad regions.

2. The semiconductor device of claim 1, wherein the pad regions and the contact insulating layers protrude from the interlayer insulating layers toward the contact plugs.

3. The semiconductor device of claim 2, wherein a first length of a respective one of the pad regions protruding from the interlayer insulating layers is substantially same as a second length of a respective one of the contact insulating layers protruding from a respective one of the interlayer insulating layers.

4. The semiconductor device of claim 1, wherein the contact plugs contact portions of upper surfaces, side surfaces, and lower surfaces of the contact insulating layers.

5. The semiconductor device of claim 1, wherein the contact insulating layers surrounding each of the contact plugs are spaced apart from each other in the first direction.

6. The semiconductor device of claim 1, wherein the contact insulating layers are spaced apart from each other and are between adjacent ones of the contact plugs.

7. The semiconductor device of claim 1, wherein the contact insulating layers comprise a material different from a material of the interlayer insulating layers.

8. The semiconductor device of claim 7, wherein the contact insulating layers comprise silicon nitride.

9. The semiconductor device of claim 1,
wherein each of the pad regions has a first pad portion including a region overlapping the contact insulating layers in the first direction, and a second pad portion surrounding the first pad portion, and
wherein the first pad portion and the second pad portion have different thicknesses.

10. The semiconductor device of claim 9,
wherein the second semiconductor structure further comprises gate dielectric layers extending along external surfaces of the gate electrodes that are parallel to the second substrate, and
wherein the gate dielectric layers are on upper and lower surfaces of the second pad portion in each of the pad regions, and do not extend to upper and lower surfaces of the first pad portion.

11. The semiconductor device of claim 1,
wherein the second semiconductor structure further comprises gate dielectric layers extending along external surfaces of the gate electrodes that are parallel to the second substrate, and
wherein side surfaces of the gate electrodes are in contact with the contact insulating layers without the gate dielectric layers interposed therebetween below the pad regions.

12. The semiconductor device of claim 1, wherein the second semiconductor structure further comprises:
sacrificial insulating layers in contact with the gate electrodes and alternately stacked with the interlayer insulating layers in a third region in which the second substrate is not disposed; and
a through-via that penetrates the sacrificial insulating layers and the interlayer insulating layers, extends into the first semiconductor structure, and comprises a same material as a material of the contact plugs.

13. The semiconductor device of claim 12, wherein the sacrificial insulating layers protrude from the interlayer insulating layers toward the through-via.

14. The semiconductor device of claim 1, wherein the contact plugs extend into the first semiconductor structure.

15. The semiconductor device of claim 1,
wherein the second semiconductor structure further comprises a substrate insulating layer that penetrates the second substrate, and
wherein lower ends of the contact plugs extend into the substrate insulating layer.

16. The semiconductor device of claim 1, wherein the second semiconductor structure further comprises:
a first horizontal conductive layer below the gate electrodes on the first region;
a horizontal insulating layer below the gate electrodes on the second region; and
a second horizontal conductive layer on the first horizontal conductive layer and the horizontal insulating layer.

17. A semiconductor device, comprising:
a substrate having a first region and a second region;
gate electrodes stacked and spaced apart from each other in a first direction perpendicular to an upper surface of the substrate, wherein the gate electrodes comprise pad regions on the second region, and wherein ones of the gate electrode are different lengths from one another and extend in a second direction on the second region;
interlayer insulating layers alternately stacked with the gate electrodes;
channel structures on the first region that penetrate the gate electrodes and extend in the first direction, wherein each of the channel structures comprises a channel layer;
contact plugs which are on the second region and penetrate the pad regions and extend in the first direction; and
contact insulating layers below the pad regions that are interposed between the gate electrodes and ones of the contact plugs,
wherein the pad regions and the contact insulating layers protrude from the interlayer insulating layers toward the contact plugs in a horizontal direction.

18. The semiconductor device of claim 17, wherein the contact plugs contact portions of upper surfaces, side surfaces, and lower surfaces of the pad regions.

19. The semiconductor device of claim 17, wherein the contact plugs have a first diameter on upper surfaces of the pad regions and a second diameter equal to or less than the first diameter below the pad regions.

20. A data storage system, comprising:
a semiconductor storage device comprising a substrate having a first region and a second region, circuit devices on one side of the substrate, and input/output pads electrically connected to the circuit devices; and
a controller electrically connected to the semiconductor storage device through one or more of the input/output pads and configured to control the semiconductor storage device,
wherein the semiconductor storage device further comprises:
gate electrodes stacked and spaced apart from each other in a first direction perpendicular to an upper surface of the substrate extend at different lengths in a second direction on the second region, and comprise pad regions on the second region;
interlayer insulating layers alternately stacked with the gate electrodes;
channel structures on the first region that penetrate the gate electrodes and extend in the first direction, wherein each of the channel structures comprises a channel layer;
contact plugs that penetrate the pad regions and extend in the first direction on the second region; and
contact insulating layers interposed between the gate electrodes and ones of the contact plugs below the pad regions,
wherein the contact plugs contact portions of upper surfaces, side surfaces, and lower surfaces of the pad regions.

* * * * *